(12) United States Patent
Derkacs

(10) Patent No.: US 10,361,330 B2
(45) Date of Patent: Jul. 23, 2019

(54) MULTIJUNCTION SOLAR CELL ASSEMBLIES FOR SPACE APPLICATIONS

(71) Applicant: SolAero Technologies Corp., Albuquerque, NM (US)

(72) Inventor: Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 315 days.

(21) Appl. No.: 15/213,594

(22) Filed: Jul. 19, 2016

(65) Prior Publication Data

US 2017/0133542 A1    May 11, 2017

Related U.S. Application Data

(60) Provisional application No. 62/243,239, filed on Oct. 19, 2015.

(51) Int. Cl.
| | |
|---|---|
| *H01L 31/0725* | (2012.01) |
| *H01L 31/05* | (2014.01) |
| *H01L 31/065* | (2012.01) |
| *H01L 31/0735* | (2012.01) |
| *H01L 31/18* | (2006.01) |
| *H01L 31/0304* | (2006.01) |
| *H01L 31/0687* | (2012.01) |

(52) U.S. Cl.
CPC .... *H01L 31/0725* (2013.01); *H01L 31/03046* (2013.01); *H01L 31/0504* (2013.01); *H01L 31/0516* (2013.01); *H01L 31/065* (2013.01); *H01L 31/0687* (2013.01); *H01L 31/0735* (2013.01); *H01L 31/1844* (2013.01); *Y02E 10/544* (2013.01); *Y02P 70/521* (2015.11)

(58) Field of Classification Search
CPC ........... H01L 31/0725; H01L 31/03046; H01L 31/05166
See application file for complete search history.

(56) References Cited

U.S. PATENT DOCUMENTS

| | | |
|---|---|---|
| 4,001,864 A | 1/1977 | Gibbons |
| 4,255,211 A | 3/1981 | Fraas |
| 4,338,480 A | 7/1982 | Antypas et al. |
| | (Continued) | |

FOREIGN PATENT DOCUMENTS

| | | |
|---|---|---|
| CN | 103426965 A | 12/2013 |
| DE | 20 2012 104 415 U1 | 2/2013 |
| | (Continued) | |

OTHER PUBLICATIONS

U.S. Appl. No. 13/872,663, filed Apr. 29, 2013, Stan et al.
(Continued)

*Primary Examiner* — Tae-Sik Kang

(57) ABSTRACT

A multijunction solar cell assembly of two or more spatially split solar cell subassemblies, each of which includes a respective monolithic semiconductor body composed of a tandem stack of solar subcells, where the subassemblies are interconnected electrically to one another so that a series electrical circuit is formed between groups of one or more subcells in each subassembly. In some cases, relatively high band gap semiconductor materials can be used for the upper subcells. The solar cell assemblies can be particularly advantageous for applications in space.

20 Claims, 15 Drawing Sheets

(5J Solar Cell)

(56) References Cited

U.S. PATENT DOCUMENTS

| | | | |
|---|---|---|---|
| 4,612,408 A | 9/1986 | Moddel et al. |
| 5,019,177 A | 5/1991 | Wanlass |
| 5,053,083 A | 10/1991 | Sinton |
| 5,217,539 A | 6/1993 | Fraas et al. |
| 5,322,572 A | 6/1994 | Wanlass |
| 5,342,453 A | 8/1994 | Olson |
| 5,376,185 A | 12/1994 | Wanlass |
| 5,479,032 A | 12/1995 | Forrest et al. |
| 5,828,088 A | 10/1998 | Mauk |
| 5,944,913 A | 8/1999 | Hou et al. |
| 6,180,432 B1 | 1/2001 | Freeouf |
| 6,239,354 B1 | 5/2001 | Wanlass |
| 6,252,287 B1 | 6/2001 | Kurtz et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,340,788 B1 | 1/2002 | King et al. |
| 6,482,672 B1 | 11/2002 | Hoffman et al. |
| 6,618,410 B1 | 9/2003 | Fischer et al. |
| 6,660,928 B1 | 12/2003 | Patton et al. |
| 6,815,736 B2 | 11/2004 | Mascarenhas |
| 6,951,819 B2 | 10/2005 | Iles et al. |
| 7,071,407 B2 | 7/2006 | Faterni et al. |
| 7,741,146 B2 | 6/2010 | Cornfeld et al. |
| 7,767,480 B1 | 8/2010 | Pickrell et al. |
| 7,785,989 B2 | 8/2010 | Sharps et al. |
| 7,960,201 B2 | 6/2011 | Cornfeld et al. |
| 8,236,600 B2 | 8/2012 | Cornfeld |
| 8,263,853 B2 | 9/2012 | Varghese |
| 8,969,712 B2 | 3/2015 | Newman et al. |
| 9,018,521 B1 | 4/2015 | Cornfeld |
| 9,252,313 B2 | 2/2016 | Meusel et al. |
| 2001/0018924 A1 | 9/2001 | Hisamatsu et al. |
| 2002/0117675 A1 | 8/2002 | Mascarenhas |
| 2003/0089392 A1 | 5/2003 | Rohr et al. |
| 2004/0166681 A1 | 8/2004 | Iles et al. |
| 2004/0200523 A1 | 10/2004 | King et al. |
| 2005/0155641 A1 | 7/2005 | Fafard |
| 2005/0247339 A1 | 11/2005 | Barnham et al. |
| 2005/0274411 A1 | 12/2005 | King et al. |
| 2006/0021565 A1 | 2/2006 | Zahler et al. |
| 2006/0144435 A1 | 7/2006 | Wanlass |
| 2006/0162768 A1 | 7/2006 | Wanlass et al. |
| 2007/0113887 A1 | 5/2007 | Laih et al. |
| 2007/0218649 A1 | 9/2007 | Hernandez |
| 2007/0277873 A1 | 12/2007 | Cornfeld et al. |
| 2008/0029151 A1 | 2/2008 | McGlynn et al. |
| 2008/0149173 A1 | 6/2008 | Sharps |
| 2008/0163920 A1 | 7/2008 | Meusel et al. |
| 2008/0185038 A1 | 8/2008 | Sharps |
| 2008/0245409 A1 | 10/2008 | Varghese et al. |
| 2009/0038679 A1 | 2/2009 | Varghese et al. |
| 2009/0078308 A1 | 3/2009 | Varghese et al. |
| 2009/0078309 A1 | 3/2009 | Cornfeld et al. |
| 2009/0078310 A1 | 3/2009 | Stan et al. |
| 2009/0078311 A1 | 3/2009 | Stan et al. |
| 2009/0155951 A1* | 6/2009 | Stan ................. H01L 31/03042 438/74 |
| 2009/0155952 A1 | 6/2009 | Stan et al. |
| 2009/0229658 A1 | 9/2009 | Stan et al. |
| 2009/0229662 A1 | 9/2009 | Stan et al. |
| 2009/0272430 A1 | 11/2009 | Cornfeld et al. |
| 2009/0272438 A1 | 11/2009 | Cornfeld |
| 2009/0288703 A1 | 11/2009 | Stan et al. |
| 2010/0012174 A1 | 1/2010 | Varghese et al. |
| 2010/0012175 A1 | 1/2010 | Vraghese et al. |
| 2010/0147366 A1 | 6/2010 | Stan et al. |
| 2010/0186804 A1 | 7/2010 | Cornfeld |
| 2010/0203730 A1 | 8/2010 | Cornfeld et al. |
| 2010/0206365 A1 | 8/2010 | Chumney et al. |
| 2010/0229913 A1* | 9/2010 | Cornfeld ........... H01L 31/06875 136/244 |
| 2011/0011983 A1 | 1/2011 | King et al. |
| 2012/0042937 A1 | 2/2012 | Wagner |
| 2012/0186641 A1* | 7/2012 | Sharps ................. H01L 31/0687 136/255 |
| 2014/0190559 A1 | 7/2014 | Meusel et al. |
| 2014/0261628 A1 | 9/2014 | Meitl et al. |
| 2015/0090321 A1 | 4/2015 | Cho et al. |
| 2016/0181464 A1 | 6/2016 | Cornfeld |

FOREIGN PATENT DOCUMENTS

| | | |
|---|---|---|
| DE | 102011115340 A1 | 4/2013 |
| DE | 10 2012 004 734 A1 | 9/2013 |
| EP | 0848433 A2 | 6/1998 |
| EP | 0 658 944 B1 | 4/2009 |
| FR | 2 878 076 A1 | 5/2006 |
| WO | WO 2004/017425 A1 | 2/2004 |
| WO | WO 2005/015638 A1 | 2/2005 |
| WO | WO 2006/072423 A1 | 7/2006 |
| WO | WO 2013/074530 A2 | 5/2013 |
| WO | WO 2013/132073 A2 | 9/2013 |

OTHER PUBLICATIONS

U.S. Appl. No. 14/828,206, filed Aug. 17, 2015, Derkacs.

Aiken et al. "Consideration of High Bandgap Subcells for Advanced Multijunction Solar Cells," Conference Record of the 2006 IEEE $4^{th}$ World Conference on Photovoltaic Energy Conversion. May 1, 2006, pp. 838-841.

Andreev et al., "High-efficiency AlGaAs—GaAs solar cells with internal Bragg reflector," Conference Record of the $24^{th}$ IEEE Photovoltaic Specialists Conference, Waikoloa, Hawaii, Dec. 5-9, 1994; vol. 2:1894-1897.

Andreev, Heterostructure solar cells, Semiconductors, Sep. 1999; 33(9):942-945.

Basic Parameters of $Al_xGa_{1-x}As$ at 300 K, [retrieved on May 19, 2016]. Retrieved from the Internet: <URL:http://www.ioffe.ru/SVA/NSM/Semicond/AlGaAs/basic.html>; 1 pg.

Basic Parameters of GaAs at 300 K, [retrieved on May 19, 2016]. Retrieved from the Internet: <URL:http://www.ioffe.ru/SVA/NSM/Semicond/GaAs/basic.html>; 1 pg.

Bett et al., "Advanced III-V solar cell structures grown by MOVPE," *Solar Energy Materials & Solar Cells*, 2001; 66:541-550.

Brown et al., "Results of the Telstar Radiation Experiments," Bell System Technical Journal, 42, 1505-1559, 1963.

Bushnell et al., "Short-circuit current enhancement in Bragg stack multi-quantum-well solar cells for multi junction space cell applications," Solar Energy Materials and Solar Cells, Jan. 2003; 75(1-2):299-305.

Cornfeld et al., "Development of a Large Area Inverted Metamorphic Multi junction (IMM) Highly Efficient AM0 Solar Cell," 33rd IEEE Photovoltaic Specialists Conference, May 11-16, 2008, San Diego, CA, USA; 5 pgs.

Cornfeld et al., "Development of a Large Area Inverted Metamorphic Multi-junction Highly Efficient AM0 Solar Cell," Conference paper presented at the $33^{rd}$ IEEE Photovoltaic Specialists Conference (May 11-16, 2008) on May 12, 2008. San Diego, CA, USA; 17 pages.

Cornfeld et al., "Advances in the Performance of Inverted Metamorphic Multi-junction Solar Cells," $23^{rd}$ European Photovoltaic Energy Conference, Sep. 1-5, 2008, Valencia, Spain; 11 pgs.

Dimroth et al., "Metamorphic $Ga_yIn_{1-y}P/Ga_{1-x}In_xAs$ tandem solar cells for space and for terrestrial concentrator applications at C > 1000 suns," Progress in Photovoltaics: Research and Applications, May/Jun. 2001; 9(3):165-178.

Dimroth et al., "Next Generation GaInP/GaInAs/Ge multi-junction space solar cells," Proceedings of the $17^{th}$ European Photovoltaic Specialists Conference, Munich Germany, Oct. 22-26, 2001, pp. 2150-2154.

Dimroth et al., "5-junction III-V solar cells for space applications," Proceedings of $3^{rd}$ World Conference on Photovoltaic Energy Conversion, Osaka, Japan, May 18, 2003; 1:616-621.

Dimroth et al., "3-6 junction photovoltaic cells for space and terrestrial concentrator applications," Conference Record of the $31^{st}$ IEEE Photovoltaic Specialists Conference, Jan. 3-7, 2005; 525-529.

(56) References Cited

OTHER PUBLICATIONS

Durbin, "A computational approach to the analysis of distributed Bragg reflectors in direct-gap solar cells," Conference Record of the 25th IEEE Photovoltaic Specialists Conference, Washington, DC, May 13-17, 1996; 69-72.
Friedman et al., "1-eV solar cells with GaInNAs active layer," Journal of Crystal Growth, Dec. 1998; 195(1-4):409-415.
Friedman et al., "0.7-eV GaInAs Junction for a GaInP/GaAs/GaInAs(leV)/GaInAs(0.7eV) Four-Junction Solar Cell," 2006 IEEE 4th World Conference on Photovoltaic Energy Conversion, May 7-12, 2006; pp. 598-602. Waikoloa, Hawaii, USA.
Geisz et al., "High-efficiency GaInP/GaAs/InGaAs triple-junction solar cells grown inverted with a metamorphic bottom junction," *Applied Physics Letters*, 2007; 91(023502):023502-1-023502-3. Online publication Jul. 10, 2007. American Institute of Physics, Melville, NY, USA.
Geisz, et al., "Inverted GaInP/(In)GaAs/InGaAs Triple-Junction Solar Cells with Low-Stress Metamorphic Bottom Junctions," 33rd IEEE Photovoltaic Specialists Conference, May 11-16, 2008, San Diego, CA, USA; 5 pgs.
Hatcher, "Solar Cell Manufacturers Come Back Down to Earth," Compound Semiconductor News, Nov. 25, 2003 [retrieved on May 19, 2016]. Retrieved from the Internet: <URL:http://www.compoundsemiconductor.net/article/83127-solar-cell-manufacturers-come-back-down-to-earth.html>; 2 pgs.
King et al., "Next-Generation, High-Efficiency III-V Multijunction Solar Cells," 28th IEEE Photovoltaic Specialists Conference, Sep. 15-22, 2000, Anchorage, AK, USA.
King et al., "High-Efficiency Space and Terrestrial Multijunction Solar Cells Through Bandgap Control in Cell Structures," 2002 Photovoltaic Specialists Conference, Conference Record of the 29th IEEE, May 19-24, 2002, New Orleans, LA, USA; pp. 776-781.
King et al., "High-voltage, low-current GaInP/GaInP/GaInNAs/Ge solar cells," Conference Record of the 29th IEEE Photovoltaic Specialists Conference, New Orleans, Louisiana, May 19-24, 2002; 852-855.
King et al., "Metamorphic III-V materials, sublattice disorder, and multijunction solar cell approaches with over 37% efficiency," Presented at the 19th European Photovoltaic Solar Energy Conference and Exhibition, Paris, France, Jun. 7-11, 2004 [retrieved on May 19, 2016]. Retrieved from the Internet: <URL:http://www.spectrolab.com/pv/support/R.%20King%20et%20al.,%20EU%20PVSEC%202004,%20Metamorphic%20III-V%20materials.pdf>; 7 pgs.
Lantratov, "Effect of the increase of radiation resistance in solar cells with internal Bragg reflector," in Proceedings of the Twenty-Seventh State-of-the-Art Program on Compound Semiconductors, edited by S. Chu, 1997, pp. 125-132.
Law et al., "Future Technology Pathways of Terrestrial III-V Multijunction Solar Cells for Concentrator Photovoltaic Systems," *Solar Energy Materials and Solar Cells*, 2010; 94:1314-1318.
Lewis et al., "The Crystallographic Connection of MOCVD-Grown Monolithic Cascade Subcells Via Transparent Graded Layers," *Journal of Crystal Growth*, 1984; 69:515-526.
Lewis et al., "Recent Developments in Multijunction Solar Cell Research," *Solar Cells*, 1988; 24:171-183.
Luque et al., "Chapter 4. Theoretical Limits of Photovoltaic Conversion," in Handbook of Photovoltaic Science and Engineering. Luque and Hegedus (eds). John Wiley & Sons, Ltd., Chichester, UK. 2003; 113-151.
Marvin, Assessment of Multijunction Solar Cell Performance in Radiation Environments, Aerospace Report No. TOR-2000 (1210)-1, 2000; 90 pages.
Meusel et al., "Spectral response measurements of monolithic GaInP/Ga(In)As/Ge triple-junction solar cells: Measurement artifacts and their explanation," Progress in Photovoltaics: Research and Applications, Dec. 2003; 11(8):499-514.
Meusel et al., "European roadmap for the development of III-V multi-junction space solar cells," 19th European Photovoltaic Solar Energy Conference, Paris, France. Jun. 7-11, 2004; 3581-3586.

"Partial European Search Report," Application No. EP 08 01 3466, dated Feb. 12, 2009. European Patent Office, Berlin, Germany.
Patel et al., "Experimental Results From Performance Improvement and Radiation Hardening of Inverted Metamorphic Multijunction Solar Cells," *IEEE Journal of Photovoltaics*, Jul. 2012; 2(3):377-381.
Schultz et al. "High Efficiency 1.0 eV GaInAs Bottom Solar Cell for 3-Junction Monolithic Stack," IEEE, 1990; 148-152.
Sexl et al., "MBE Growth of Metamorphic In(Ga)AIAs Buffers," 1997 IEEE International Symposium on Compound Semiconductors, Sep. 1997; IEEE, Piscataway, NJ; pp. 49-52.
Sharps et al., "Inverting the triple junction improves efficiency and flexibility," *Compound Semiconductor*, Oct. 2001, 13(9):25-28. IOP Publishing, Ltd., Bristol, England.
Shvarts et al., "Radiation resistant AlGaAs/GaAs concentrator solar cells with internal Bragg reflector," Solar Energy Materials and Solar Cells, Mar. 2001; 68(1):105-122.
Sinharoy et al., "Progress in the Development of Metamorphic Multi-junction III-V Space Solar Cells," *Progress in Photovoltaics: Research and Applications*, Feb. 2002; 10:427-432. John Wiley & Sons, Ltd, Hoboken, NJ, USA.
Stan et al., "Very High Efficiency Triple Junction Solar Cells by MOVPE," 14th International Conference of Metalorganic Vapor Phase Epitaxy. Jun. 1-6, 2008, Metz, France; 32 pgs.
Tada et al., Solar Cell Radiation Handbook, Third Edition, JPL Publication 82-69, 1982; cover page, face page and Table of Contents; 7 pgs.
Takamoto et al., "InGaP/GaAs-based Multijunction Solar Cells," *Progress in Photovoltaics: Research and Applications*, 2005; 13:495-511.
Tobin et al., "Enhanced light absorption in GaAs solar cells with internal Bragg reflectors," Conference Record of the 22nd IEEE Photovoltaic Specialists Conference, Las Vegas, NV, Oct. 7-11, 1991; vol. 1:147-152.
Trupke et al., "Improved spectral robustness of triple tandem solar cells by combined series/parallel interconnection," J. Appl. Phys., 2004; 96:2347-2351.
Venkatasubramanian et al., "An Inverted-Growth Approach to Development of an IR-Transparent, High-Efficiency AlGaAs/GaAs Cascade Solar Cell," 22nd IEEE Photovoltaic Specialists Conference, Oct. 7-11, 1991, Las Vegas, NV, USA; pp. 93-98.
Vernon et al., Growth and characterization of $Al_xGa_{1-x}As$ Bragg reflectors by LP-MOCVD, Journal of Electronic Materials, Mar. 1992; 21(3):335-340.
Wanlass et al., "Lattice-Mismatched Approaches for High-Performance, III-V Photovoltaic Energy Converters," Proceedings of the 31st IEEE PVSC, Jan. 3-7, 2005, Lake Buena Vista, FL, USA; pp. 530-535.
Wanlass et al., "Monolithic, Ultra-Thin GaInP/GaAs/GaInAs Tandem Solar Cells," 2006 IEEE 4th World Conference on Photovoltaic Energy Conversion, May 7-12, 2006, Waikoloa, Hawaii, USA; pp. 729-732.
Wurfel, *Physics of Solar Cells: from Basic Principles to Advanced Concepts*, 2nd Updated and Expanded Edition, 2009. Sections 6.4, 6.5 and 6.8; 20 pages. Wiley-VCH, Weinheim, Germany.
Yamaguchi, "Physics and Technologies of Superhigh-Efficiency Tandem Solar Cells," *Semiconductors*, Sep. 1999; 33(9):961-964, Toyota Technological Institute, Nagoya, Japan, © 1999, American Institute of Physics.
Yamaguchi, "Multi-junction solar cells and novel structures for solar cell applications," *Physica E*, 2002; 14:84-90.
Yoon et al., "Progress of Inverted Metamorphic III-V Solar Cell Development at Spectrolab," 33rd IEEE Photovoltaic Specialists Conference, May 11-16, 2008, San Diego, CA, USA; 6 pgs.
L. M. Fraas et al, "34% Efficient InGaP/GaAs/GaSb Cell-Interconnected-Circuits for Line-Focus Concentrator Arrays", Proceedings of the 16th European Photovoltaic Solar Energy Conference (James & James Ltd.) (2000) 929.
Search Report and Opinion dated Mar. 17, 2017 for European Patent Application No. 16187299.9, 12 pages.

(56) References Cited

OTHER PUBLICATIONS

Search Report and Opinion dated Mar. 21, 2017 for European Patent Application No. 16194190.1, 13 pages.

* cited by examiner

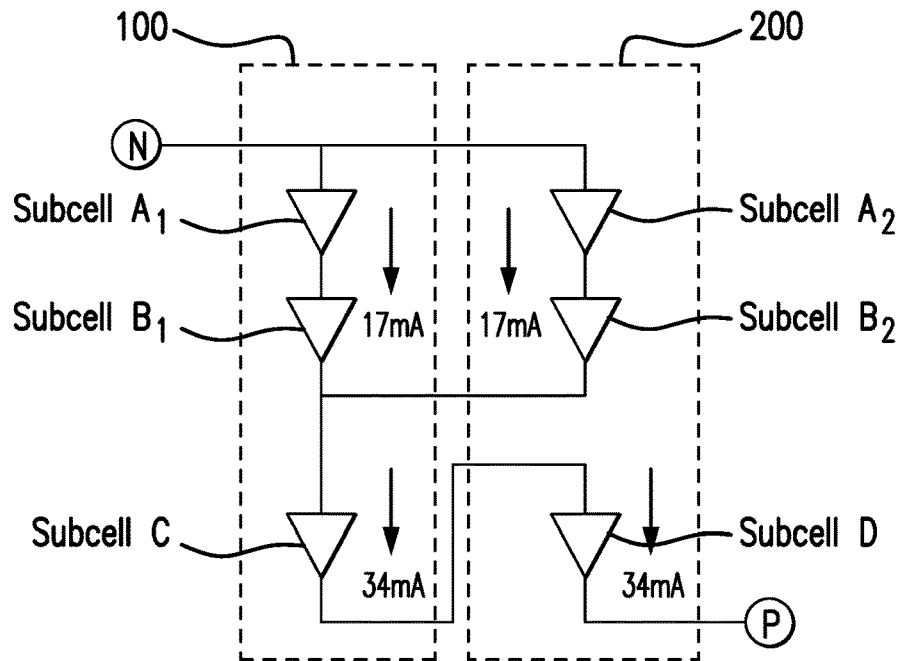
FIG. 7A  (4J Solar Cell)
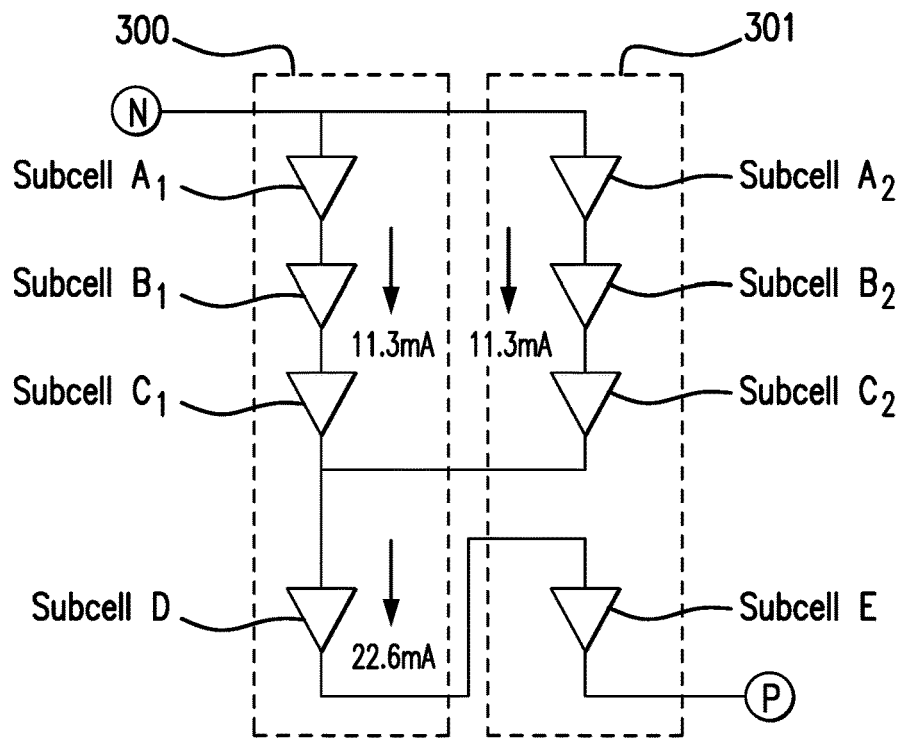
FIG. 7B  (5J Solar Cell)

(6J Solar Cell)

MULTIJUNCTION SOLAR CELL ASSEMBLIES FOR SPACE APPLICATIONS

REFERENCE TO RELATED APPLICATIONS

This application claims the benefit of U.S. Provisional Application No. 62/243,239 filed Oct. 19, 2015.

The present application is related to U.S. patent application Ser. No. 15/203,975 filed Jul. 7, 2016.

This application is also related to co-pending U.S. patent application Ser. Nos. 14/828,197 and 14/828,206 filed Aug. 17, 2015.

This application is also related to co-pending U.S. patent application Ser. No. 14/660,092 filed Mar. 17, 2015, which is a division of U.S. patent application Ser. No. 12/716,814 filed Mar. 3, 2010, now U.S. Pat. No. 9,018,521; which was a continuation in part of U.S. patent application Ser. No. 12/337,043 filed Dec. 17, 2008.

This application is also related to co-pending U.S. patent application Ser. No. 13/872,663 filed Apr. 29, 2012, which was also a continuation-in-part of application Ser. No. 12/337,043, filed Dec. 17, 2008.

This application is also related to U.S. patent application Ser. No. 13/941,936 filed Jul. 15, 2013 and U.S. patent application Ser. No. 13/491,390 filed Jun. 7, 2012.

All of the above related applications are incorporated herein by reference in their entirety.

BACKGROUND OF THE INVENTION

Field of the Invention

The present disclosure relates to solar cells and the fabrication of solar cells, and more particularly the design and specification of a multijunction solar cell using electrically coupled but spatially separated semiconductor bodies based on III-V semiconductor compounds.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at the "end of life" (EOL).

The efficiency of energy conversion, which converts solar energy (or photons) to electrical energy, depends on various factors such as the design of solar cell structures, the choice of semiconductor materials, and the thickness of each subcell. In short, the energy conversion efficiency for each solar cell is dependent on the optimum utilization of the available sunlight across the solar spectrum as well as the "age" of the solar cell, i.e. the length of time it has been deployed and subject to degradation associated with the temperature and radiation in the deployed space environment. As such, the characteristic of sunlight absorption in semiconductor material, also known as photovoltaic properties, is critical to determine the most efficient semiconductor to achieve the optimum energy conversion to meet customer requirements of intended orbit and lifetime.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays or panels, with the individual solar cells connected together in an electrical series and/or parallel circuit. The shape and structure of an array, as well as the number of cells it contains, are determined in part by the desired output voltage and current.

The electrical characteristics of a solar cell, such as the short circuit current density ($J_{sc}$), the open circuit voltage ($V_{oc}$), and the fill factor, are affected by such factors as the number of subcells, the thickness of each subcell, the composition and doping of each active layer in a subcell, and the consequential band structure, electron energy levels, conduction, and absorption of each subcell, as well as its exposure to radiation in the ambient environment over time. The overall power output and conversion efficiency of the solar cell are thereby affected in different and often unpredictable ways. Such factors also vary over time (i.e. during the operational life of the system).

Accordingly, it is evident that the consideration of any one design parameter or variable, such as the amount of a particular constituent element in a layer, or the band gap of that layer, affects each of the electrical characteristics in a different way, sometimes in opposite directions, and such changes does not predictably lead to an increase in power output or solar cell efficiency. Stated another way, focus on any one such parameter in the design of a multijunction solar cell is not a viable calculus since each variable standing alone is NOT a simple "result effective" variable that can be simplistically adjusted by those skilled in the art confronted with complex design specifications and practical operational considerations in order to achieve greater power output or a related design objective of the solar cell.

Another parameter of consideration taught by the present disclosure is the difference between the band gap and the open circuit voltage, or ($E_g/q-V_{oc}$), of a particular active layer, and such parameter may vary depending on subcell layer thicknesses, doping, the composition of adjacent layers (such as tunnel diodes), and even the specific wafer being examined from a set of wafers processed on a single supporting platter in a reactor run.

One of the important mechanical or structural considerations in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters. Although such conventional wisdom suggests that all subcells be lattice matched to achieve the most power output, the present application departs from that conventional wisdom in that at least one subcell is not lattice matched with the other matched subcells.

SUMMARY

The present application is directed to solar cells with several substantially lattice matched subcells, but including at least one subcell which is lattice mismatched, and in a particular embodiment to a five junction (5J) solar cell using electrically coupled but spatially separated four junction (4J) semiconductor bodies based on III-V semiconductor compounds.

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 1.2, or 1.3 to 1.4, or 1.5 to 1.9 eV.

Briefly, and in general terms, the present disclosure describes solar cells that include a solar cell assembly of two or more solar cell subassemblies, each of which includes a respective monolithic semiconductor body composed of a tandem stack of solar subcells, where the subassemblies are interconnected electrically to one another.

As described in greater detail, the inventors of the present application have discovered that interconnecting two or more spatially split multi-junction solar cell subassemblies can be advantageous. The spatial split can be provided for multiple solar cell subassemblies monolithically formed on a single substrate. Alternatively, the solar cell subassemblies can be fabricated as separate semiconductor chips that can be coupled together electrically.

One advantage of interconnecting two or more spatially split multi-junction solar cell subassemblies is that such an arrangement can allow accumulation of the current from all of the subcells in different semiconductor bodies into one, two or more "bottom" subcells.

Further, selection of relatively high band gap semiconductor materials for the top subcells can provide for increased photoconversion efficiency in a multijunction solar cell for outer space or other applications over the operational life of the photovoltaic power system. For example, increased photoconversion efficiency at a predetermined time after initial deployment of the solar cell can be achieved.

Thus, in one aspect, a monolithic solar cell subassembly includes a first semiconductor body including an upper first solar subcell composed of (aluminum) indium gallium phosphide ((Al)InGaP); a second solar subcell disposed adjacent to and lattice matched to said upper first subcell, the second solar subcell composed of (aluminum) gallium arsenide ((Al)GaAs) or indium gallium arsenide phosphide (InGaAsP); and a bottom subcell lattice matched to said second subcell and composed of germanium (Ge).

The convention of the use of the parenthesis in a representation of a compound is that the element enclosed within the parenthesis is an optional constituent. The subcells are configured so that the current density of the upper first subcell and the second subcell have a substantially equal predetermined first value, and the current density of the bottom subcell is at least twice that of the predetermined first value.

In other implementations of four or more subcells, the middle subcells may be composed of gallium arsenide or other suitable semiconductor.

In some implementations, the average band gap of all of the subcells is greater than 1.44 eV. In some instances, the band gap of the first upper subcell is in the range of 2.0 to 2.20 eV, the band gap of the second subcell is in the range of 1.65 to 1.8 eV, a third subcell at a band gap of about 1.4 eV, and the band gap of the bottom subcell is in the range of 0.6 to 0.8 eV. Other implementations may have different band gap ranges.

In some implementations, the first semiconductor body further includes one or more of the following features. For example, there may be a first highly doped lateral conduction layer disposed adjacent to and beneath the second solar subcell. The first semiconductor body also can include a blocking p-n diode or insulating layer disposed adjacent to and beneath the highly doped lateral conduction layer. The first semiconductor body may further include a second highly doped lateral conduction layer disposed adjacent to and beneath the blocking p-n diode or insulating layer. The bottom solar subcell can be disposed adjacent to and beneath the second highly doped lateral conduction layer.

Some implementations can include additional solar subcells. For example, there can be a third solar subcell disposed adjacent to and lattice matched to the second solar subcell.

The solar cell subassembly can further include a plurality of openings in the first semiconductor body, each of the openings extending from a top surface of the first semiconductor body to a different respective contact layer in the first semiconductor body. Such "openings" may include recesses, cavities, holes, gaps, cut-outs, or similar structures, but for simplicity we will subsequently just use the term "opening" throughout this disclosure. In other implementations, we can etch through the rear of the substrate and have all the openings come from the backside. This approach is more efficient as it does not shadow the top 2 or top 3 solar cells, but it results in a solar film of only a few 10s of microns thickness.

Thus, for example, a first opening in the first semiconductor body can extend from the top surface of the semiconductor body to a bottom contact layer of the second subcell. A second opening in the first semiconductor body can extend from the top surface of the semiconductor body to a contact layer of the bottom subcell. A respective metallic contact pad can be disposed on each of the contact layers.

In some implementations, the short circuit current density ($J_{sc}$) of the InGaP first upper subcell is approximately 17 mA/cm². In other cases, the short circuit current density ($J_{sc}$)

of the InGaP first upper subcell is approximately 17.3 mA/cm$^2$. The short circuit current density ($J_{sc}$) of the first upper subcell may have another value for different implementations.

In another aspect, a solar cell assembly includes a terminal of first polarity and a terminal of second polarity. The solar cell assembly includes a first semiconductor body including a tandem vertical stack of at least a first upper, a second and a third solar subcells, the first upper subcell having a top contact connected to the terminal of first polarity. The solar cell assembly further includes a second semiconductor body disposed adjacent to the first semiconductor body and including a tandem vertical stack of at least a first upper, a second and a third bottom solar subcells, the third bottom subcell having a bottom contact connected to the terminal of second polarity. The third subcell of the first semiconductor body is connected in a series electrical circuit with the third subcell of the second semiconductor body.

Some implementations include one or more of the following features. For example, in some cases, the upper first subcell of the first semiconductor body is composed of indium gallium phosphide (InGaP); the second solar subcell of the first semiconductor body is disposed adjacent to and lattice matched to said upper first subcell, the second solar subcell composed of aluminum gallium arsenide (AlGaAs) or indium gallium arsenide phosphide (InGaAsP), and the third subcell is the bottom subcell of the first semiconductor body and is lattice matched to said second subcell and is composed of germanium (Ge).

In other implementations of four or more subcells, the middle subcells may be composed of a gallium arsenide or other suitable semiconductor.

In some instances, the upper first subcell of the first semiconductor body is composed of aluminium indium gallium phosphide (AlInGaP); the second solar subcell of the first semiconductor body is disposed adjacent to and lattice matched to said upper first subcell, and is composed of aluminum gallium arsenide (AlGaAs); and the third subcell is disposed adjacent to and lattice matched to said second subcell and is composed of gallium arsenide (GaAs).

The first semiconductor body further can include a first highly doped lateral conduction layer disposed adjacent to and beneath the second solar subcell. The first semiconductor body further can include, a blocking p-n diode or insulating layer disposed adjacent to and beneath the highly doped lateral conduction layer. The first semiconductor body further can include a second highly doped lateral conduction layer disposed adjacent to and beneath the blocking p-n diode or insulating layer.

In some implementations, the solar cell assembly further includes a third middle solar subcell composed of gallium arsenide (GaAs) disposed adjacent to and beneath the second solar subcell.

In some cases (e.g., for an assembly having two subassemblies), the short circuit current density ($J_{sc}$) of each of the first and second subcells is approximately 17 mA/cm$^2$. In other instances (e.g., for an assembly having two or three subassemblies), the short circuit current density ($J_{sc}$) of each of the first, second and third middle subcells is approximately 11 mA/cm$^2$. The short circuit current density ($J_{sc}$) of the bottom subcell in the foregoing cases can be approximately 34 mA/cm$^2$. However, the short circuit current densities ($J_{sc}$) may have different values in some implementations.

In some implementations of a 5J solar cell, the solar cell assembly will comprise two subassemblies, and a 6J solar cell assembly will comprise three subassemblies.

Various contact layers in the first and second semiconductor bodies can be interconnected electrically. For example, in some instances, a conductive interconnect extends between a contact layer of the first upper subcell of the first semiconductor body to a contact layer of the first upper subcell of the second semiconductor body. Further, a conductive interconnect can extend between a bottom contact layer of the second subcell of the first semiconductor body to a bottom contact layer of the second subcell of the second semiconductor body. Another conductive interconnection can extend from a contact layer for the bottom subcell of the first semiconductor body to a contact layer for a lateral conduction layer of the second semiconductor body.

Some implementations provide one or more of the following advantages. For example, some implementations provide increased photoconversion efficiency in a multijunction solar cell for outer space applications over the operational life of the photovoltaic power system.

In particular, some implementations provide a multijunction solar cell in which the selection of the composition of the subcells and their band gaps maximizes the efficiency of the solar cell at a predetermined high temperature (in the range of 40 to 100 degrees Centigrade) in deployment in space at AM0 at a predetermined time after the initial deployment, such time being at least one year, and in the range of one to twenty-five years.

At higher temperatures, the present disclosure contemplates the use of higher average bandgap designs like the embodiment of a 5J solar cell. This is because the temperature coefficient is lower and such a device loses less power at temperatures above 28° C.

Further, some implementations provide a multijunction solar cell in which the selection of the composition of the subcells and their band gaps maximizes the efficiency of the solar cell at a predetermined low intensity low temperature (LILT) environment, specifically intensity being less than 0.1 suns, and temperatures being between minus 150 and minus 100 degrees Centigrade, such as associated with space missions to Mars or Jupiter or beyond, in deployment at a predetermined time after the initial deployment, such time being at least five, ten, fifteen or twenty years.

At lower temperatures, the present disclosure would provide lower average band gap designs like the 4J solar cell because such a solar cell would gain more power at lower temperatures due to the higher temperature coefficient.

Further still, some implementations provide in a multijunction solar cell in which the selection of the composition of the subcells and their band gaps maximizes the efficiency of the solar cell at a predetermined high temperature (e.g., in the range of 40 to 100 degrees Centigrade) in deployment in space at AM0 at a predetermined time after the initial deployment, such time being at least one, five, ten, or fifteen years.

Some implementations provide a four junction solar cell in which the average band gap of all four cells (i.e. the sum of all band gaps, divided by four) is greater than 1.44 eV.

Some implementations provide a three junction solar cell in which the average band gap of all three cells (i.e. the sum of all band gaps, divided by three) is greater than 1.165 eV.

Some implementations provide a lattice matched four junction solar cell in which the current through the bottom subcell is intentionally designed to be substantially greater than current through the top three subcells when measured at the "beginning-of-life" or time of initial deployment.

Some implementations provide a lattice matched three junction solar cell in which the current through the bottom subcell is intentionally designed to be substantially greater than current through the top two subcells when measured at the "beginning-of-life" or time of initial deployment.

Some implementations may incorporate or implement fewer of the aspects and features. In some cases, additional layer(s) may be added or deleted in the cell structure without departing from the scope of the present disclosure.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

FIG. 7A illustrates schematically a four-junction solar cell assembly.

FIG. 7B illustrates schematically a five-junction solar cell assembly.

GLOSSARY OF TERMS

Figure 1A:
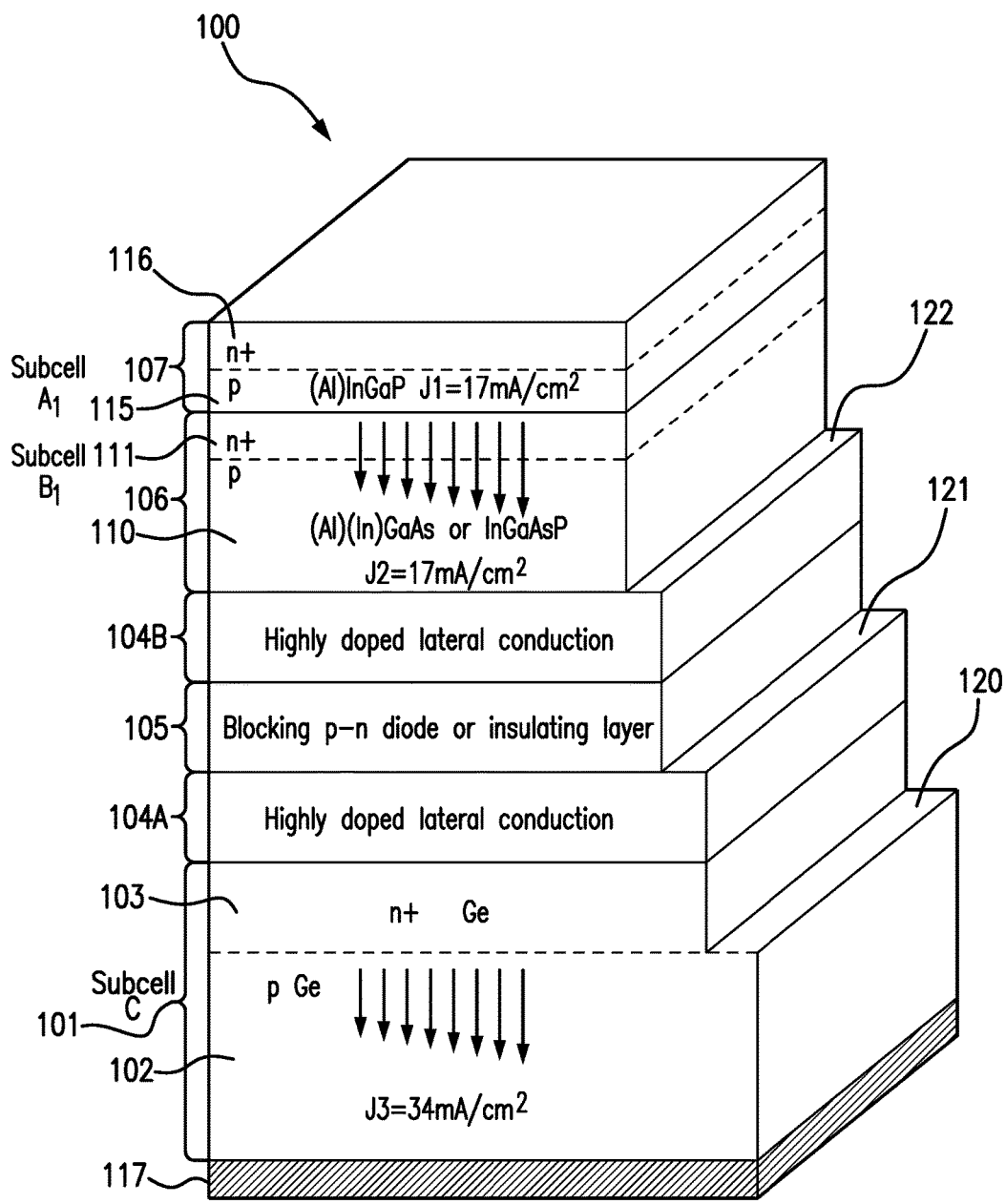
FIG. 1A illustrates an example of a first solar cell subassembly.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which are to be the "top" subcells facing the solar radiation in the final deployment configuration, are deposited or grown on a growth substrate prior to depositing or growing the lower band gap subcells, following which the growth substrate is removed leaving the epitaxial structure.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electro-optical semiconductor device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT(S)

Details of the present invention will now be described including example implementations. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells and inverted metamorphic multijunction solar cells are disclosed in the related applications noted above. Some, many or all of such features may be included in the structures and processes associated with the solar cells of the present disclosure. However, more particularly, the present disclosure is directed, in various aspects, to a particular arrangement of semiconductor layers to provide a novel multijunction solar cells and solar cell assemblies.

A variety of different features of multijunction solar cells (including inverted metamorphic multijunction solar cells) are disclosed in the related applications noted above. In some implementations, some or all of such features may be included in the structures and processes associated with the lattice matched or "upright" solar cell assemblies of the present disclosure.

The present disclosure may be adapted to inverted metamorphic multijunction solar cells that include, for example, three, four, five, or six subcells.

The present disclosure describes a process for the fabrication of multijunction solar cells that, in some instances, improve light capture in the associated subcell and thereby the overall efficiency of the solar cell. More specifically, the present disclosure describes a relatively simple and reproducible technique that is suitable for use in a high volume production environment in which various semiconductor layers are deposited in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

Prior to describing the specific embodiments of the present disclosure, a brief discussion of some of the issues associated with the design of multijunction solar cells, and in particular inverted metamorphic solar cells, and the context of the composition or deposition of various specific layers in embodiments of the product as specified and defined by the Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

Improvement in absorption efficiency is well known to be achieved by a tandem multijunction solar cell in which each subcell absorbs only a narrow energy band spectrum (or range of wavelengths). By connecting an optical series of subcells, each one with continuously decreasing energy gaps, the entire illumination energy will be converted into electricity. Since the subcells are also connected in an electrical series, current flows through each of the subcells, with the voltage associated with each subcell is determined by the material physical characteristics of each subcell.

In view of the foregoing, it is further evident that the identification or proportion of one particular constituent element (e.g. indium, or aluminum) in a particular subcell, or the thickness, band gap, doping, or other characteristic of the incorporation of that material in a particular subcell, is not a single, independent "result effective variable" that one skilled in the art can simply specify and incrementally adjust to a particular level and thereby increase the efficiency of a solar cell and its power output. The efficiency of a solar cell is not a simple linear algebraic equation as a function of the amount of gallium or aluminum or other element or material variable in a particular layer. The electrical characteristics of a semiconductor layer, such as the short circuit current ($J_{sc}$), the open circuit voltage ($V_{oc}$), and the fill factor (FF), are affected by several factors as the number of subcells, the thickness of each subcell, the composition and doping of each active layer in a subcell. The consequential band structure, electron energy levels, conduction, and absorption of photons of different wavelengths and diffusion lengths in each subcell are not easily mathematically computable as a function of any one, two or small number of distinct single material variables. As an example, the power output may be stipulated to be a product of voltage and current in a subcell, but a simpleminded "result effective variable" approach to change a material variable (such as the amount of an element or doping in the layer), to thereby increase the voltage in a subcell in anticipation that it may result in greater power output, may in fact lead to a decrease in current, or a current mismatch between adjacent subcells in a tandem solar cell, or other interdependent effects (e.g., increased dopants diffusing into other layers and thereby adversely affecting them), with the overall effect of decreasing the power output of the solar cell.

The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The growth processes for the solar cells described here can use, for example, a MOCVD process in a standard, commercially available reactor suitable for high volume production. The processes can be particularly suitable for producing commercially viable multijunction solar cells or inverted metamorphic multijunction solar cells using commercially available equipment and established high-volume fabrication processes, as contrasted with merely academic expositions of laboratory or experimental results.

Layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

As described in greater detail, the inventors of the present application have discovered that interconnecting two or more spatially split multi-junction solar cell subassemblies can be advantageous. The spatial split can be provided for multiple solar cell subassemblies monolithically formed on the same substrate. Alternatively, the solar cell subassemblies can be fabricated as separate semiconductor chips that can be coupled together electrically.

In general terms, a solar cell assembly in accordance with one aspect of the present disclosure, can include a terminal of first polarity and a terminal of second polarity. The solar cell assembly includes a first semiconductor subassembly including a tandem vertical stack of at least a first upper, a second and a third solar subcells, the first upper subcell having a top contact connected to the terminal of first polarity. A second semiconductor subassembly is disposed adjacent to the first semiconductor subassembly and includes a tandem vertical stack of at least a first upper, a second and a third bottom solar subcells, the third bottom subcell having a bottom contact connected to the terminal of second polarity. The third subcell of the first semiconductor subassembly is connected in a series electrical circuit with the third subcell of the second semiconductor subassembly.

In some cases, the foregoing solar cell assembly can provide increased photoconversion efficiency in a multijunction solar cell for outer space or other applications over the operational life of the photovoltaic power system.

Figure 1B:
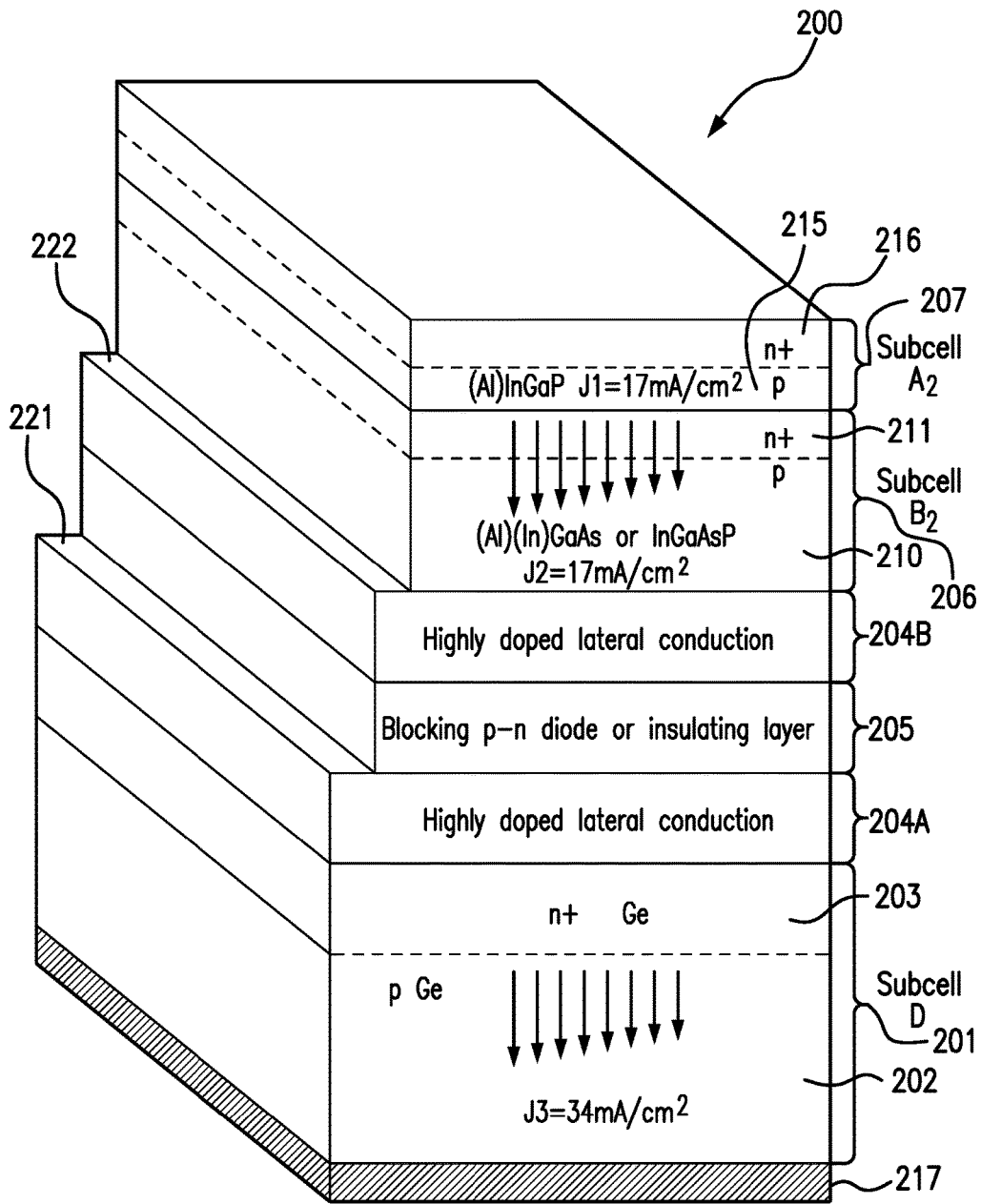
FIG. 1B illustrates an example of a second solar cell subassembly.

Examples of individual monolithic solar cell subassemblies that can be coupled together in the manner described above are described in connection with FIGS. 1A and 1B. In FIGS. 1A and 1B, each solar cell subassembly 100, 200 can be implemented, for example, as a separate semiconductor chip.

As illustrated in FIG. 1A, in accordance with one aspect of the disclosure, a first solar cell subassembly 100 includes multiple solar subcells in a tandem stack. In the illustrated example, the subassembly 100 includes an upper first subcell 107 (Subcell A1), a second middle solar subcell 106 (Subcell B1) disposed adjacent to and lattice matched to the upper first subcell 107, and a bottom subcell 101 (Subcell C) lattice matched to the second subcell 106. In the illustrated example, the subcells 101, 106, 107 are configured so that the short circuit current densities of the upper first subcell 107 and the second subcell 106 have a substantially equal predetermined first value (J1=J2), and the short circuit current density (J3) of the bottom subcell 101 is at least twice that of the predetermined first value.

In the example of FIG. 1A, the upper first subcell 107 is composed of (aluminum) indium gallium phosphide ((Al)InGaP), the second solar subcell 106 is composed of (aluminum) gallium arsenide ((Al)GaAs) or indium gallium arsenide phosphide (InGaAsP), and the bottom subcell 101 is composed of germanium (Ge) or gallium arsenide (GaAs). Each of the subcells includes a respective junction formed, respectively, by p type and n+ type regions of the semiconductor material for the particular subcell. Thus, for example, the upper subcell 107 includes adjacent p and n+ regions 115, 116 of (Al)InGaP. Likewise, the second subcell 106 includes adjacent p and n+ regions 110, 111 of AlGaAs or InGaAsP. Similarly, the bottom subcell 101 includes adjacent p and n+ regions 102, 103 of Ge or GaAs.

The first solar cell subassembly 100 of FIG. 1A can include additional semiconductor layers as well, such as highly doped lateral conduction layers 104A, 104B and a blocking p-n diode or insulating layer 105 disposed between the first and second subcells 107, 106. In this case, the blocking p-n diode or insulating layer 105 is adjacent to, and sandwiched between, the highly doped lateral conduction layers 104A, 104B. Thus, the first highly doped lateral conduction layer 104A is disposed adjacent to and beneath the blocking p-n diode or insulating layer 105. Likewise, the blocking p-n diode or insulating layer 105 is disposed adjacent to and beneath the second highly doped lateral conduction layer 104B.

In some implementations, such as a triple junction solar cell, the band gap of the first upper subcell 107 is in the range of 1.85 to 1.95 eV, the band gap of the second subcell 106 is in the range of 1.4 to 1.5 eV, and the band gap of the bottom subcell 201 is in the range of 0.6 to 0.8 eV.

In some implementations, in a four junction device, the band gap of the first upper subcell 107 is 2.0 to 2.2 eV, the band gap of the second subcell 106 is in the range of 1.65 to 1.8 eV, and the band gap of the third solar cell is 1.41 eV, and the band gap of the bottom subcell 201 is in the range of 0.6 to 0.8 eV. In such an implementation, the average band gap of the top three subcells is at least 1.44 eV.

The solar cell subassembly 100 also includes electrically conductive contacts (see, e.g., metallization 117) on the bottom of the subcell 101.

As described in greater detail below, different layers in the solar cell subassembly 100 can be connected electrically to one another. Further in some cases, two or more spatially separated multijunction solar cell subassemblies can be connected together electrically, for example, through electrically conductive interconnects. In order to provide access to the various layers so as to facilitate such connections, various ones of the layers in the solar cell subassembly 100 can be exposed partially. Thus, as shown in the example of FIG. 1A, various layers are partially exposed, for example, using standard photolithographic etching techniques to etch from the top surface of the subassembly 100 to the particular contact layer(s) 120, 121, 122 of interest (i.e., the bottom contact layer 122 for the second subcell 106; the bottom contact layer 121 for blocking p-n diode or insulating layer 105; and the bottom contact layer 120 for the n+ layer 103 of the bottom subcell 101).

FIG. 1B illustrates a second solar cell subassembly 200, which is similar to the solar cell subassembly 100 of FIG. 1A. The second solar cell subassembly 200 can have substantially the same sequence of semiconductor layers with the same compositions and bandgaps as the corresponding layers in the first solar cell subassembly 100. Thus, the solar cell subassembly 200 also includes multiple subcells in a tandem stack. In the illustrated example of FIG. 1B, the second solar cell subassembly 200 includes an upper first subcell 207 (Subcell A2), a second solar subcell 206 (Subcell B2) disposed adjacent to and lattice matched to the upper first subcell 207, and a bottom subcell 201 (Subcell D) lattice matched to the second subcell 206. As with the first solar cell subassembly 100, the subcells 201, 206, 207 of the second solar cell subassembly can be configured so that the short circuit current densities of the upper first subcell 207 and the second subcell 206 have a substantially equal predetermined first value (J1=J2), and the short circuit current density (J3) of the bottom subcell 201 is at least twice that of the predetermined first value.

Referring to example of FIG. 1B, the upper first subcell 207 is composed of (aluminum) indium gallium phosphide ((Al)InGaP), the second solar subcell 206 is composed of (aluminum) gallium arsenide ((Al)GaAs) or indium gallium arsenide phosphide (InGaAsP), and the bottom subcell 201 is composed of germanium (Ge) or other suitable semiconductor material. Each of the subcells includes a respective junction formed, respectively, by p type and n+ type regions of the semiconductor material for the particular subcell. Thus, for example, the upper subcell 207 includes adjacent p and n+ regions 215, 216 of (Al)InGaP. Likewise, the second subcell 206 includes adjacent p and n+ regions 210, 211 of (Al)GaAs or InGaAsP. Similarly, the bottom subcell 201 includes adjacent p and n+ regions 202, 203 of Ge or other suitable semiconductor material.

The second solar cell subassembly 200 also can include a blocking p-n diode or insulating layer 205 sandwiched between first and second highly doped lateral conduction layers 204A, 204B. Electrically contacts (e.g., 217) can be provided, respectively, over the top and bottom subcells 207, 201.

In order to provide access to the various layers in the second solar cell subassembly 200, various ones of the layers can be exposed partially. Thus, as shown in the example of FIG. 1B, various surfaces are partially exposed, for example, using standard photolithographic etching techniques to etch from the top surface of the semiconductor body 200 to the particular contact layer 221, 222 of interest (i.e., the bottom contact layer 222 for the second subcell 206; and the bottom contact layer 221 for blocking p-n diode or insulating layer 205).

The foregoing multijunction solar cell subassemblies 100 or 200 can be fabricated, for example, in wafer-level processes and then diced into individual semiconductor chips. The various semiconductor layers can be grown, one atop another, using known growth techniques (e.g., MOCVD) as discussed above.

Figure 2:
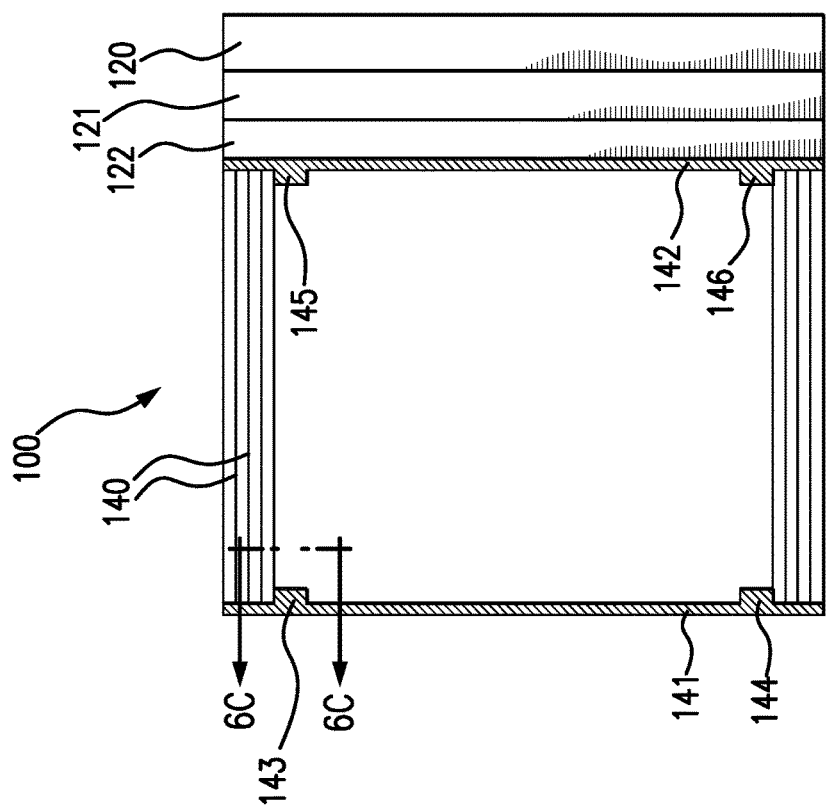
FIG. 2 is a top view of the first solar cell subassembly of FIG. 1.

Each solar cell subassembly 100, 200 also can include grid lines, interconnecting bus lines, and contact pads. FIG. 2 illustrates an example of a top view of the solar cell subassembly 100, which includes grid lines 140, interconnecting bus lines 142, and electrically conductive contacts 143, 144, 145, 146. The solar cell subassembly 200 can include similar grid lines, interconnecting bus lines, and contact pads. The geometry and number of the grid lines, bus lines and/or contacts may vary in other implementations.

Figure 3A:
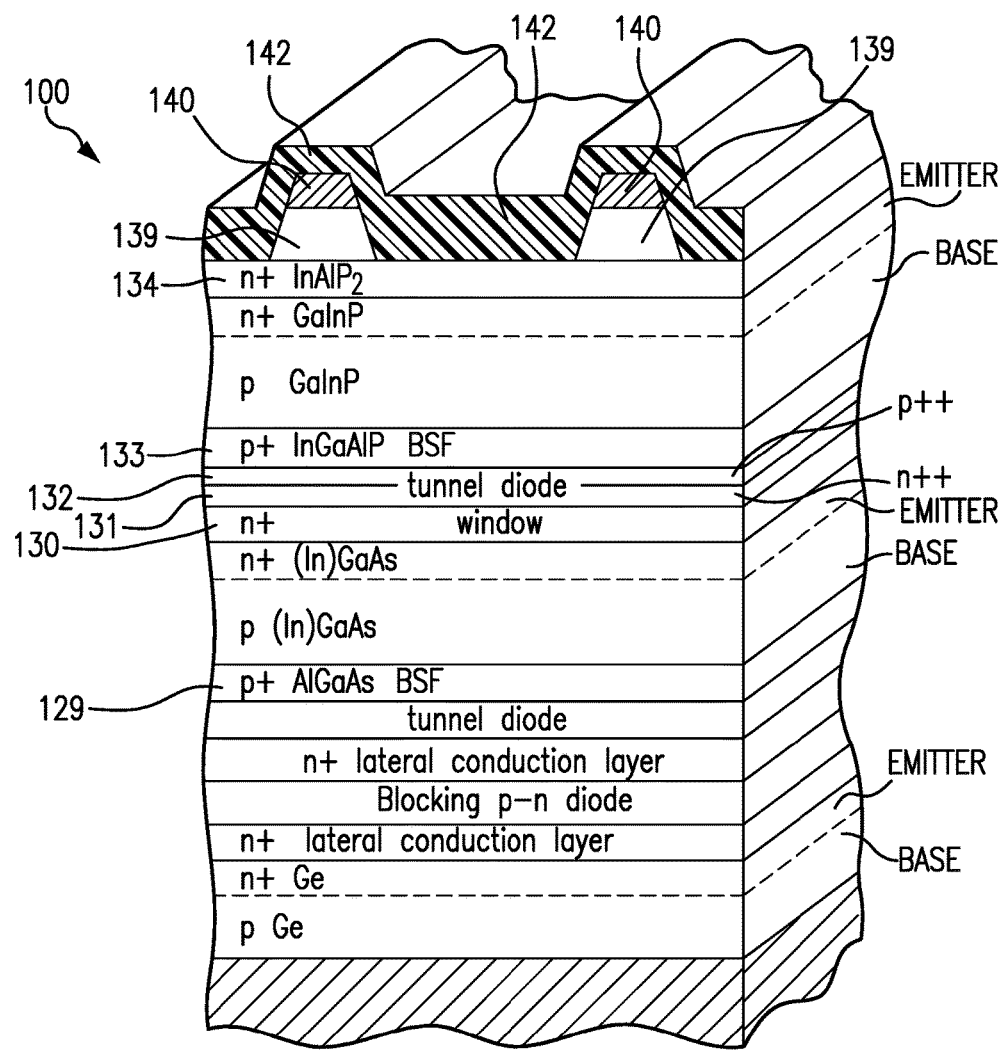
FIGS. 3A and 3B illustrate further details and additional layers that may be present in some implementations of the solar cell subassemblies.
Figure 3B:
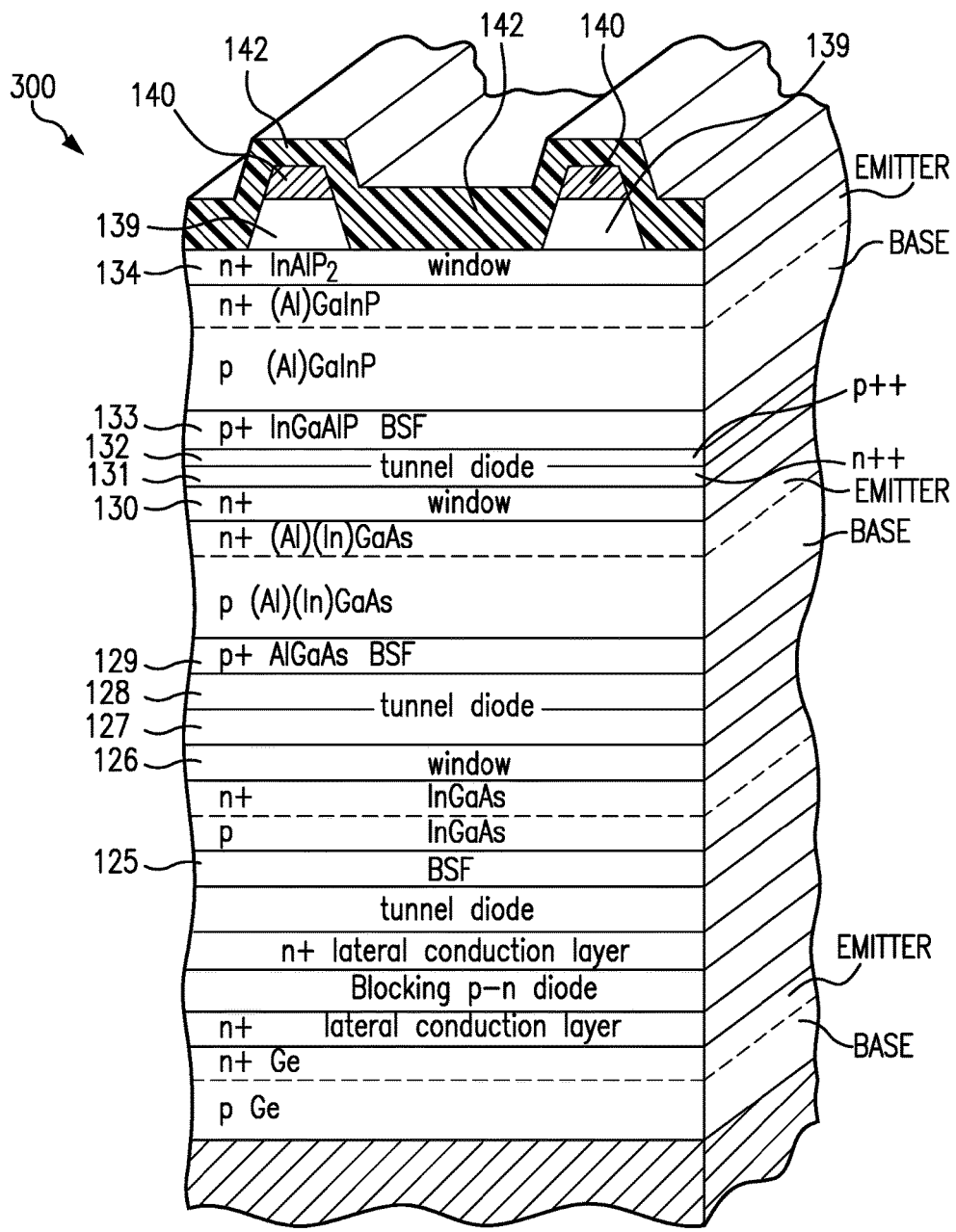

FIGS. 3A and 3B illustrate further details and additional layers that may be present in some implementations of the solar cell subassemblies 100, 200. For example, each of the subcells can include a respective base and emitter. One or more back surface field (BSF) layers 125, 129, 133 can be provided in the solar cell subassemblies 100, 200. The BSF layers drive minority carriers from the region near the base/BSF interface surface to minimize the effect of recombination loss. Thus, a BSF layer reduces recombination loss at the backside of the solar subcell and thereby reduces the recombination in the base. Also, in some instances, a sequence of heavily doped p-type (p++) and n-type (n++) layers (e.g., 127/128, 131/132), which form respective tunnel diodes, can be provided adjacent one or more of the BSF layers. Such tunnel diodes serve as a circuit elements to connect adjacent subcells; they can provide a low electrical resistance and optically low-loss connection between two subcells. Further, some implementations include one or more window layers 126, 130, 134, which can operate to reduce recombination loss and/or improve the passivation of the cell surface of the underlying junctions. The window layers can be composed, for example, of n+ InAlP$_2$. Additional layers may be added and/or some layers may be omitted in some implementations.

FIGS. 3A and 3B also illustrate the contact layer 139 and grid lines 140 over the top window layer 134. The grid lines 140 can be formed, for example, by placing a photoresist mask over a contact layer 139, depositing metallization via evaporation, and then performing lithographic patterning. The mask then is lifted off to form the metal grid lines 140. An antireflective (ARC) dielectric coating layer 142 can be applied over the entire surface of the solar cell subassembly on the side with the grid lines 140.

Figure 4A:
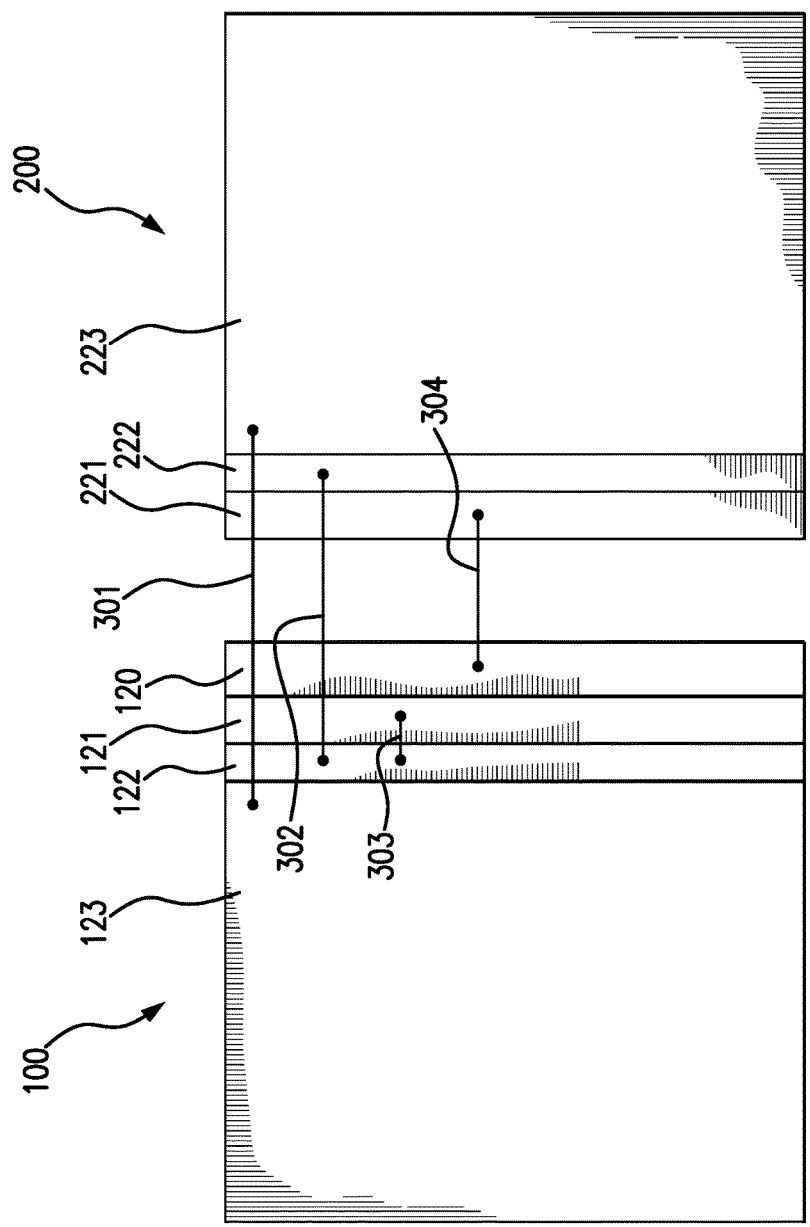
FIG. 4A illustrates a solar cell assembly that includes interconnections between the first and second solar cell subassemblies.

As previously mentioned, two (or more) solar cell subassemblies (e.g., 100 and 200) can be connected together electrically. For example, as shown in FIG. 4A, conductive (e.g., metal) interconnections 301, 302, 303, 304 can be made between different layers of the solar cell subassemblies 100, 200. Some of the interconnections are made between different layers of a single one of the solar cell subassembly, whereas others of the interconnections are made between the two different solar cell subassemblies. Thus, for example, the interconnection 303 electrically connects together the contact layers 121 and 122 of the first solar cell subassembly 100. The other interconnections 301, 302, 304 electrically connect together a contact layer in the first solar cell subassembly 100 to a contact layer in the second solar cell subassembly 200. In particular, interconnection 301 connects together a contact on the contact layer 123 of the upper subcell 107 of the first solar cell subassembly 100 to a contact on the contact layer 223 of the upper subcell 207 of the second solar cell subassembly 200. Similarly, the interconnection 302 connects together a contact on the contact layer 122 of the first solar cell subassembly 100 to a contact on the contact layer 222 of the second solar cell subassembly 200. Likewise, the interconnection 304 connects together a contact on the contact layer 120 for the bottom subcell 101 of the first solar cell subassembly 100 to a contact on the contact layer 221 for the lateral conduction layer 204A of the second solar cell subassembly 200.

Figure 4B:
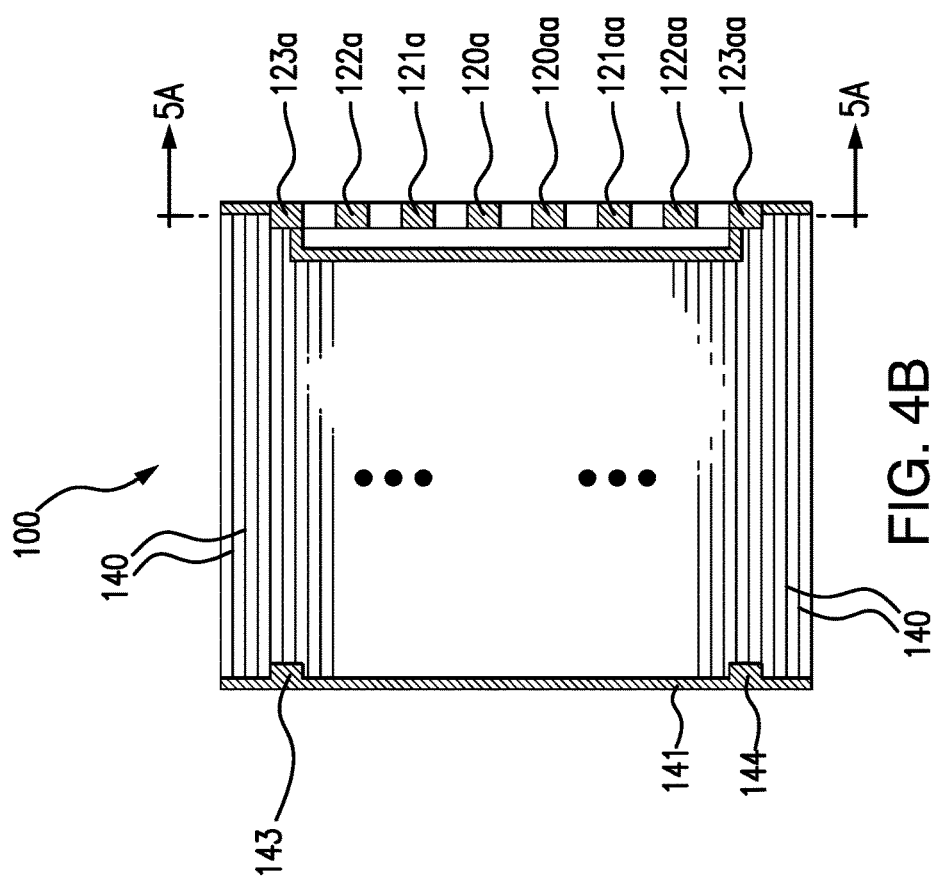
FIG. 4B illustrates a top view of the first solar cell subassembly showing additional details.

In some instances, multiple electrically conductive (e.g., metal) contacts can be provided for each of the respective contact layers 120-123 and 221-222 of the solar cell subassemblies 100, 200. This allows each of the interconnections 301-304 to be implemented by multiple interconnections between the solar cell subassembly layers rather than just a single interconnection. For example, as illustrated in FIGS. 4B and 5A, the first solar cell subassembly 100 includes two contacts 123a, 123aa on the contact layer 123 of the upper subcell 107. Likewise, there are two contacts 120a, 120aa on the contact layer 120, two contacts 121a, 121aa on the contact layer 121, and two contacts 122a, 122aa on the contact layer 122. Further, as illustrated in FIG. 5D, the second solar cell subassembly 200 also can include two contacts 221, 221c on the contact layer 221, two contacts 222b, 222c on the contact layer 222, and two contacts 223a, 223b on the contact layer 223 of the upper subcell 207.

As described above, the contact layers 120, 121, 122 of the first solar cell subassembly 100 on which the contacts 120a, 120aa, 121a, 121aa, 122a, 122aa are disposed, and the contact layers 221, 222 of the second solar cell subassembly 200 on which the contacts 221, 221c, 222b, 222c are disposed, can be exposed, for example, by etching openings (e.g., trenches or cut-outs) 120c, 120d, 121b, 122b, 121bb, 121bb (FIG. 5A) and 221a, 222b, 222a, 222b (FIG. 5D) from the upper surface of the respective solar cell subassembly down to the appropriate surfaces 120-123 and 221-222. As indicated by FIGS. 1A, 1B and as shown in FIGS. 5A, 5D, the cut-out openings 120c, 120d, 121b, 122b, 121bb, 121bb, 221a, 222b, 222a, 222b are provided at side edges of the respective solar cell subassemblies 100, 200. Metallic contacts then can be provided on the contact layers 120-123 and 221-222.

The contacts 123a, 123aa on the contact layer 123 of the first solar cell subassembly 100 can be electrically connected together by a metal trace 131 (FIG. 5A). Likewise, the contacts 223a, 223b on the contact layer 223 of the second solar cell subassembly 200 can be electrically connected together by a metal trace 231 (FIG. 5D).

Figure 5B:
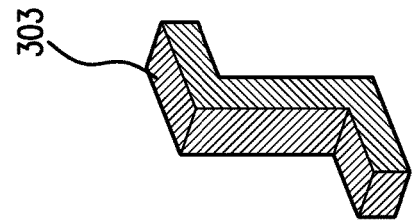
FIG. 5B illustrates an example of an interconnection for a solar cell subassembly.
Figure 5A:
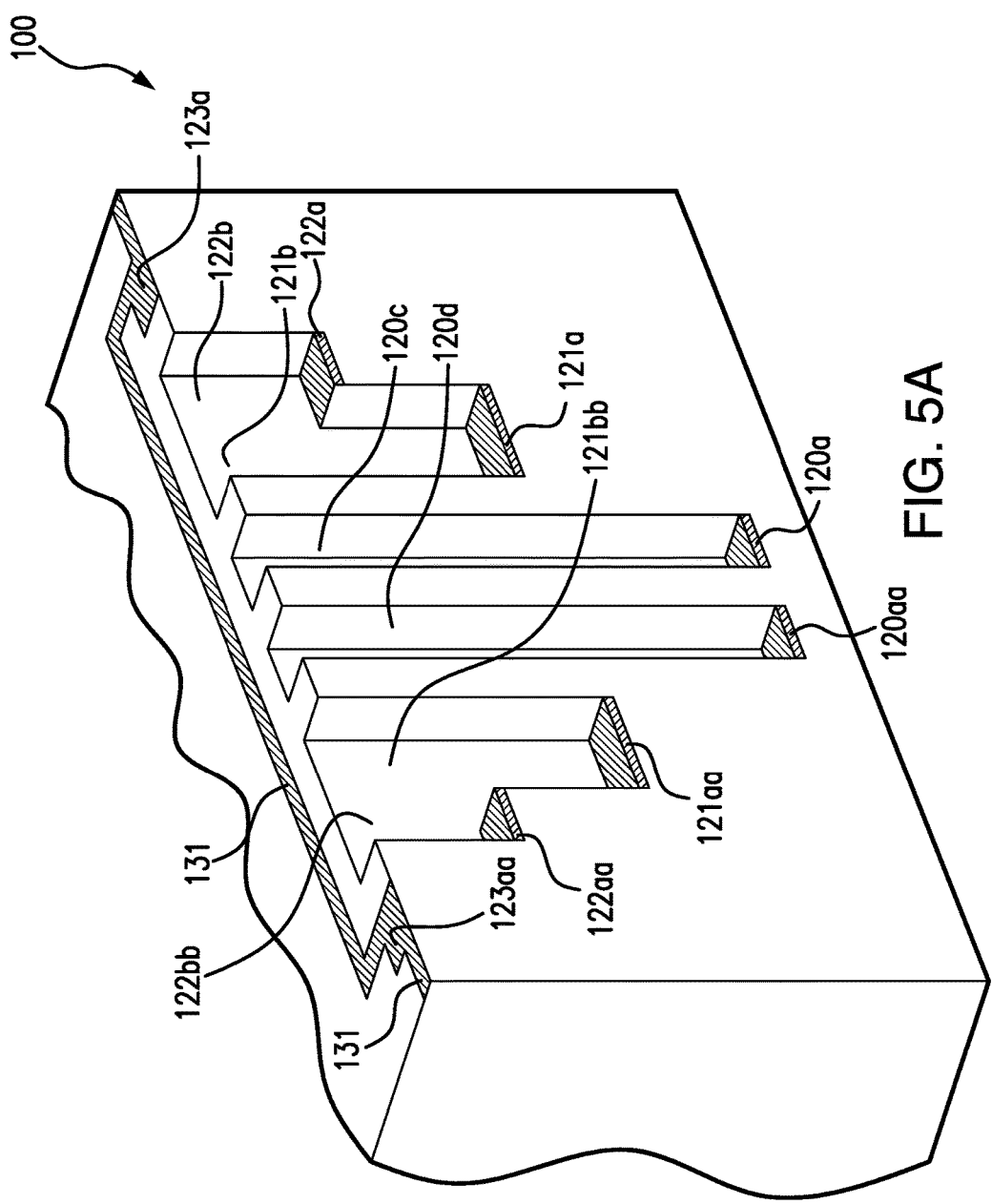
FIG. 5A is an example of a side view of the first solar cell subassembly.
Figure 5C:
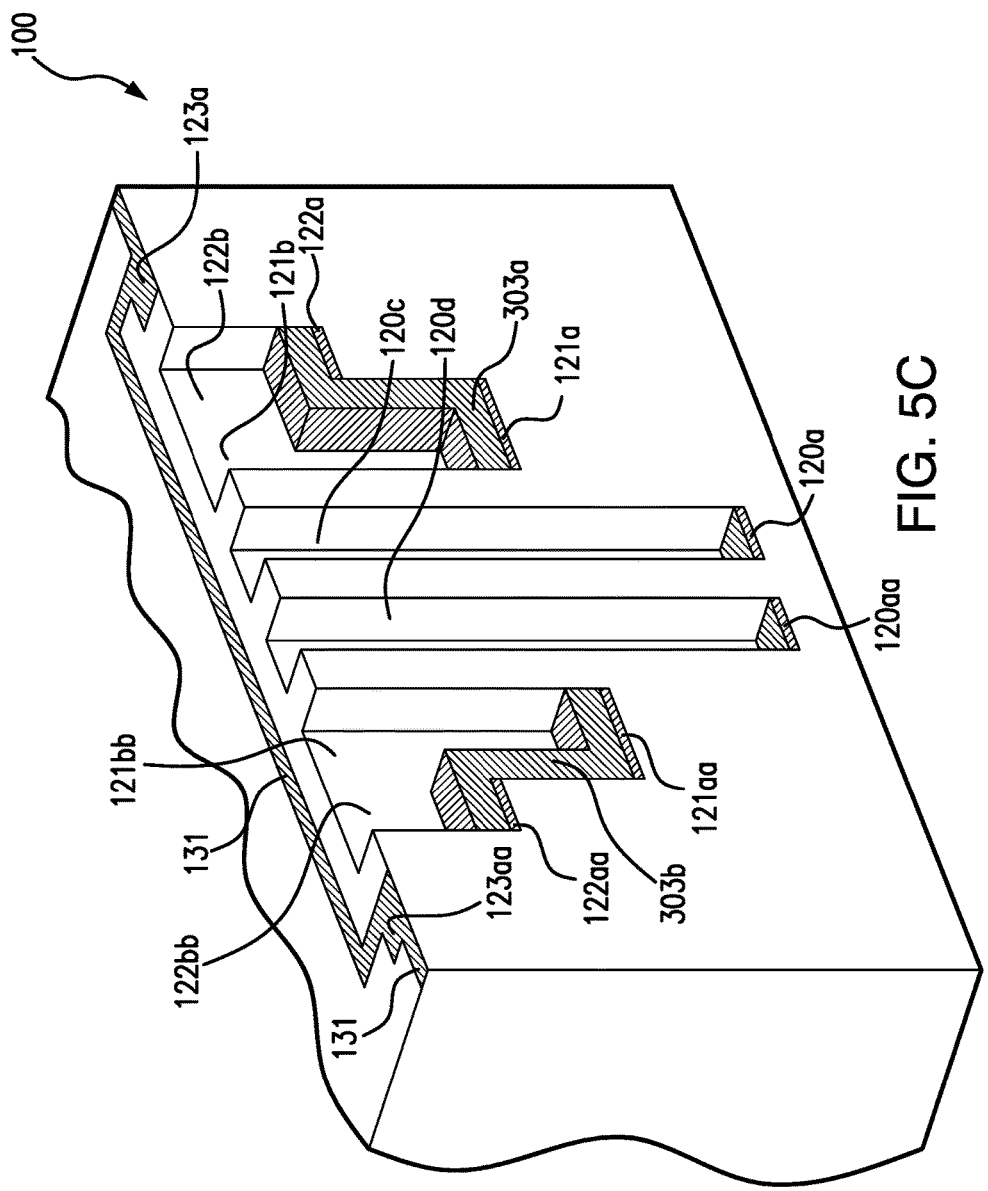
FIG. 5C shows an example of a side view of the first solar cell subassembly including the interconnection of FIG. 5B.
Figure 5D:
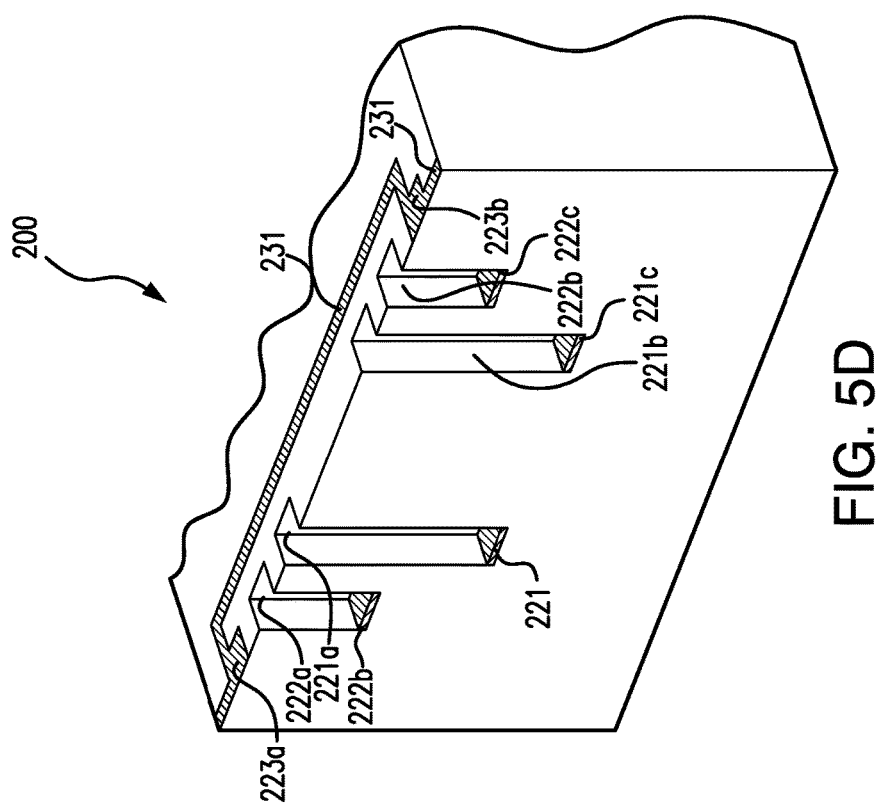
FIG. 5D is an example of a side view of the second solar cell subassembly.

FIG. 5B illustrates an example of the intra-cell interconnection 303 that can be used to electrically couple the contacts 121a, 122a in the first solar cell subassembly 100. A similar intra-cell interconnection 303 can be used to electrically couple the contacts 121aa, 122aa. The intra-cell interconnections 303 (individually shown as 303a, 303b in FIG. 5C) are sized and shaped to fit within the openings 121*b*, 122*bb* so that one end of each interconnection 303 rests on, and is in electrical contact with, a first one of the contacts (e.g., 121*a* or 121*aa*) and a second end of the interconnection rests on, and is in electrical contact with, a second adjacent contact (e.g., 122*a* or 122*aa*).

Figure 5E:
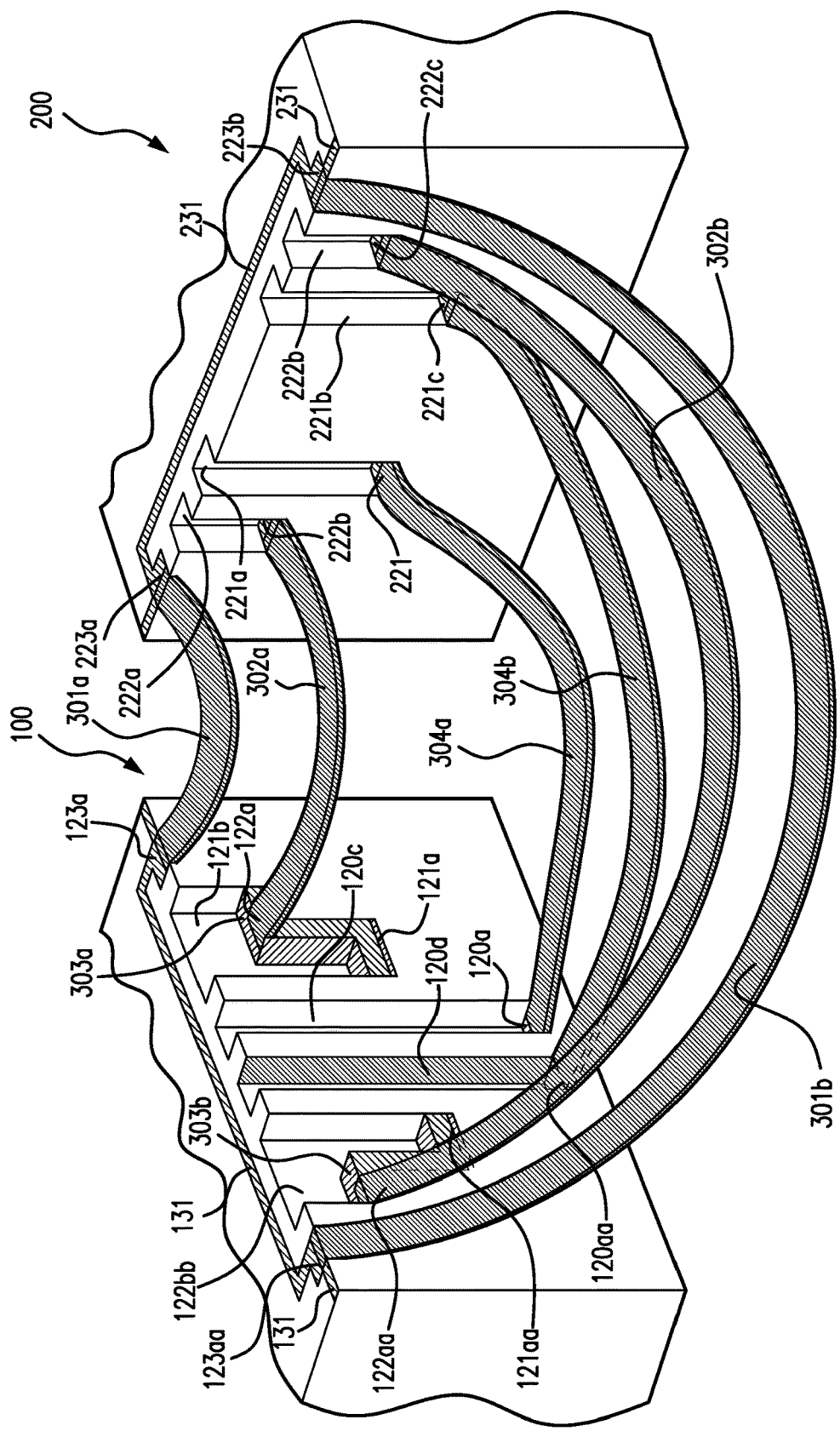
FIG. 5E shows an example of a solar cell assembly including interconnections between the first and second solar cell subassemblies.

FIG. 5E illustrates an example of the conductive interconnections 301*a*, 301*b*, 302*a*, 302*b*, 304*a*, 304*b* between the two solar cell subassemblies 100, 200. These inter-cell interconnections can be implemented, for example, by metal wiring that extends between the respective contact layers of the solar cells.

Figure 6A:
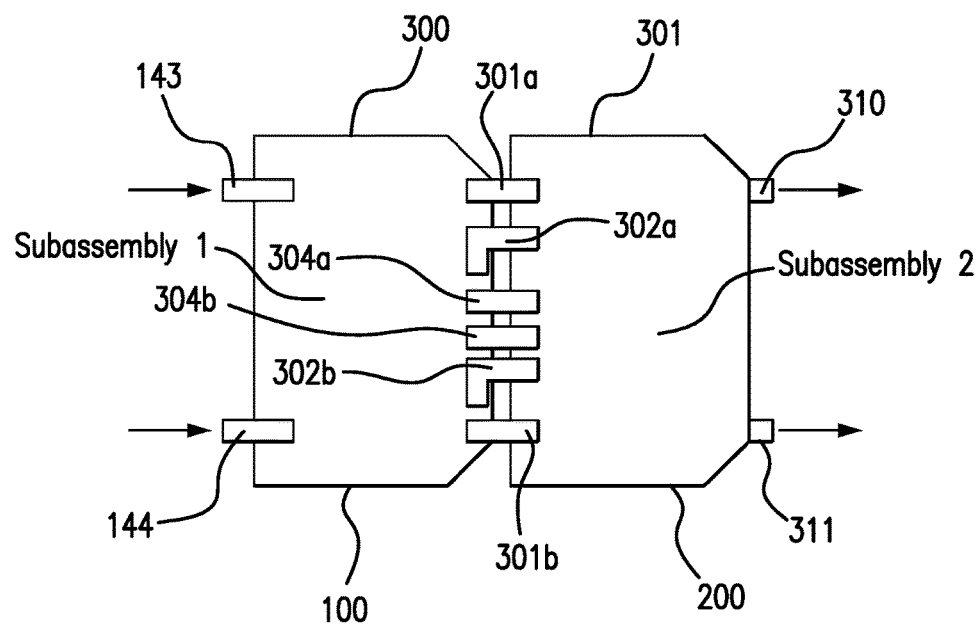
FIG. 6A illustrates an example of a solar cell assembly including two solar cell subassemblies.
Figure 6B:
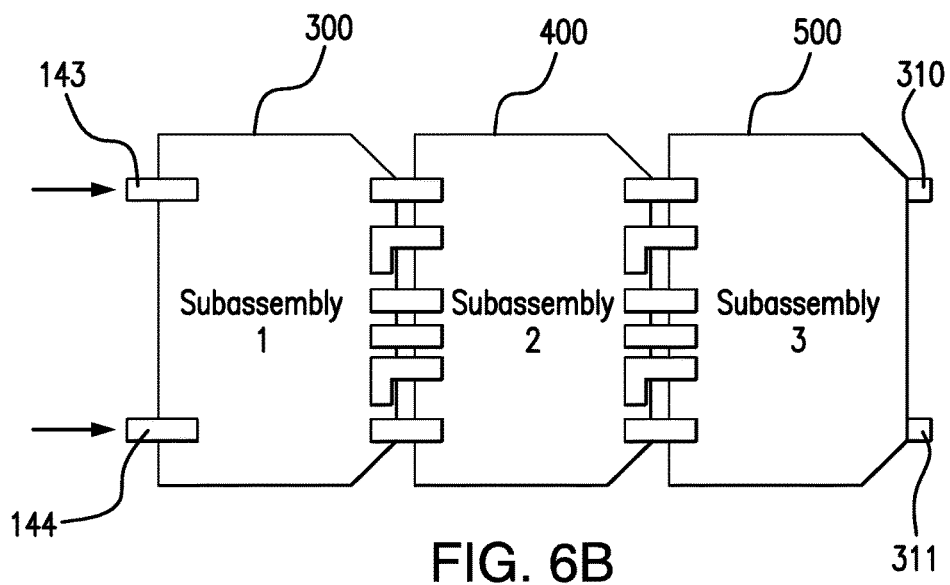
FIG. 6B illustrates an example of solar cell assembly including three solar cell subassemblies.

As illustrated in FIGS. 6A and 6B, two or more solar cell subassemblies can be connected electrically as described above to obtain a multijunction (e.g., a four-, five- or six-junction) solar cell assembly. In FIGS. 6A and 6B, the top side (n) conductive contacts 143, 144 and bottom side (p) conductive contacts 310, 311 for the solar cell assembly are visible, respectively, at the left and right-hand sides of the assembly.

FIG. 7A illustrates schematically an example of a four-junction solar cell assembly that includes two solar cell subassemblies 100, 200, each of which has three subcells. The solar cell subassemblies 100, 200 are connected electrically in the manner described in connection with FIGS. 5A-5E. In the illustrated example, the short circuit current density ($J_{sc}$) of the upper subcells (A1 and A2) and the middle subcells (B1 and B2) is about 17 mA/cm². The short circuit current density ($J_{sc}$) of the bottom subcells (C and D) is about 34 mA/cm². Other implementations may have different values.

Although FIG. 7A illustrates an example for a four-junction solar cell assembly, other implementations may include more than four junctions (e.g., a five-junction solar cell assembly or a six-junction solar cell assembly). Thus, FIG. 7B illustrates an example of a five-junction solar cell assembly that includes two solar cell subassemblies 300, 301, each of which includes four subcells. The bottom (i.e., fourth) subcell of the first subassembly 300 is connected in a series electrical circuit with the bottom (i.e., fourth) subcell of the second subassembly 301. On the other hand, the upper cells of the two solar cell subassemblies 300, 301 are connected in parallel. Likewise, the middle subcells of the two solar cell subassemblies 300, 301 are connected in parallel with one another (i.e., subcells A1, B1, C1 are connected in parallel with subcells A2, B2, C2). The techniques described in connection with FIGS. 5A-5E can be used to connect together electrically the various contact layers of the solar cell subassemblies 300, 301 in the manner indicated by FIG. 7B.

In the example of FIG. 7B, one solar cell subassembly 300 includes an upper subcell A1, two middle subcells B1, C1, and a bottom subcell D. The other solar cell subassembly 301 includes an upper subcell A2, two middle subcells B2, C2, and a bottom subcell E. In some implementations, each solar cell subassembly 300, 301 has band gaps in the range of 2.0 to 2.20 eV (or higher) for the top subcell, and (i) 1.65 to 1.8 eV, and (ii) 1.41 eV for the middle subcells, and 0.6 to 0.8 eV, for the bottom subcell, respectively. Further, in some embodiments, the average band gap of all four subcells (i.e., the sum of the four band gaps of each subcell divided by four) in a given solar cell subassembly 300 or 301 is greater than 1.44 eV. Other band gap ranges may be appropriate for some implementations.

In some instances, the fourth (i.e., bottom) subcell is composed of germanium. The indirect band gap of germanium at room temperature is about 0.66 eV, while the direct band gap of germanium at room temperature is 0.8 eV. Those skilled in the art will normally refer to the "band gap" of germanium as 0.66 eV, since it is lower than the direct band gap value of 0.8 eV. Thus, in some implementations, the fourth subcell has a direct band gap of greater than 0.75 eV. Reference to the fourth subcell having a direct band gap of greater than 0.75 eV is expressly meant to include germanium as a possible semiconductor material for the fourth subcell, although other semiconductor materials can be used as well. For example, the fourth subcell may be composed of InGaAs, GaAsSb, InAsP, InAlAs, or SiGeSn, or other III-V or II-VI compound semiconductor materials.

In some implementations of a five-junction solar cell assembly, such as in the example of FIG. 7B, the short circuit current density ($J_{sc}$) of the upper first subcells (A1, and A2) and the middle subcells (B1, B2, C1, C2) is about 11.3 mA/cm², and the short circuit current density ($J_{sc}$) of the bottom subcells (D and E) is about 34 mA/cm². Other implementations may have different values.

Figure 7C:
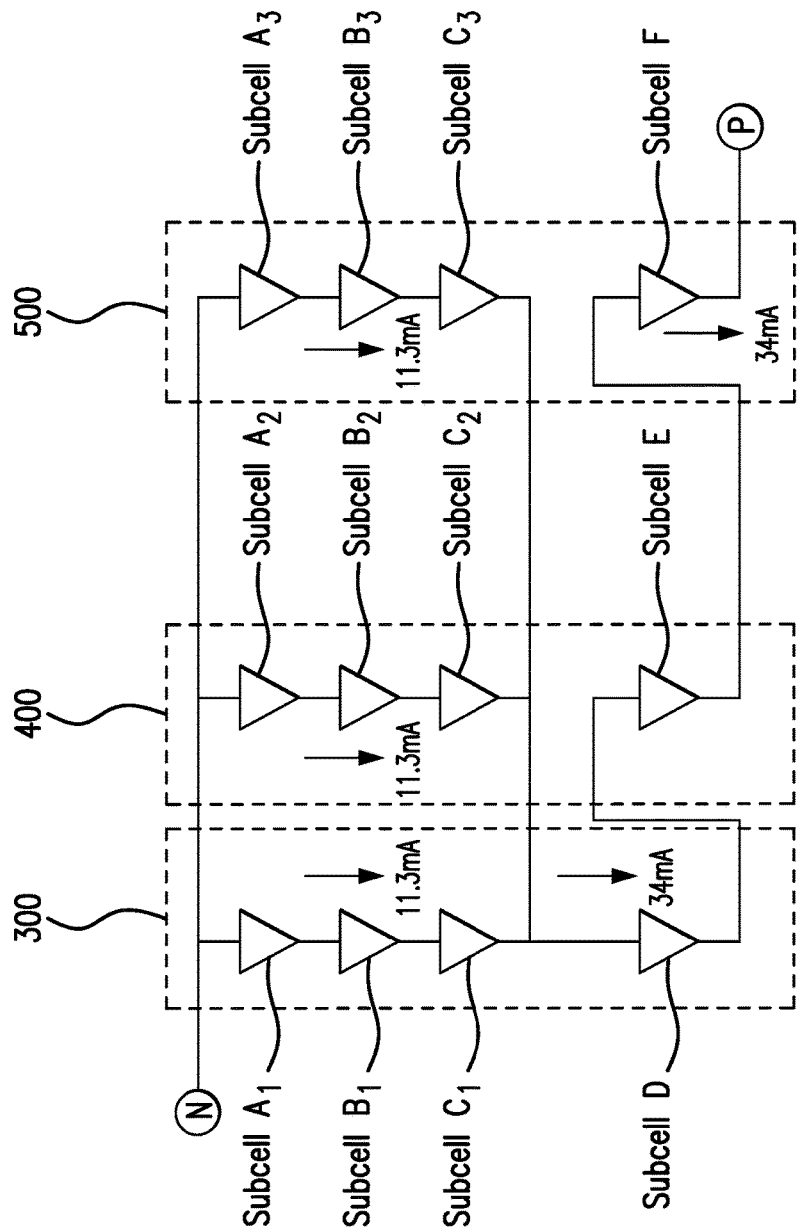
FIG. 7C illustrates schematically a six-junction solar cell assembly.

FIG. 7C illustrates an example of a six-junction solar cell assembly that includes three solar cell subassemblies 300, 400, 500, each of which includes four subcells. In the illustrated example, the first solar cell subassembly 300 includes an upper subcell A1, two middle subcells B1, C1, and a bottom subcell D. The second solar cell subassembly 400 includes an upper subcell A2, two middle subcells B2, C2, and a bottom subcell E. The third solar cell subassembly 500 includes an upper subcell A3, two middle subcells B3, C3, and a bottom subcell F. The bottom (i.e., fourth) subcell of the first subassembly 300 is connected in a series electrical circuit with the bottom (i.e., fourth) subcell of the second subassembly 400, which in turn in connected in a series electrical circuit with the bottom (i.e., fourth) subcell of the third subassembly 500. On the other hand, the upper cells of the solar cell subassemblies 300, 400, 500 are connected in parallel. Likewise, the middle subcells of the solar cell subassemblies 300, 400, 500 are connected in parallel with one another (i.e., subcells A1, B1, C1 are connected in parallel with subcells A2, B2, C2 and in parallel with subcells A3, B3, C3). The techniques described in connection with FIGS. 5A-5E can be used to connect together electrically the various contact layers of the solar cell subassemblies 300, 400, 500 in the manner indicated by FIG. 7C. In some instances, the compositions of the various solar cell subassemblies 300, 400, 500 are the same as described above for the 4-subcell subassemblies 300, 301 in FIG. 7B.

In some implementations of a six-junction solar cell assembly, such as in the example of FIG. 7C, the short circuit current density ($J_{sc}$) of the upper first subcells (A1, A2 and A3) and the middle subcells (B1, B2, B3 and C1, C2, C3) is about 11.3 mA/cm², and the short circuit current density ($J_{sc}$) of the bottom subcells (D, E and F) is about 34 mA/cm². Other implementations may have different values.

Various modifications can be made in some implementations. For example, in some instances, a distributed Bragg reflector (DBR) layer is provided adjacent to and between the third and the fourth solar subcells and arranged so that light can enter and pass through the third solar subcell and at least a portion of which can be reflected back into the third solar subcell by the DBR layer. In other embodiments, the DBR layer may be provided alternatively, or in addition, between the second and third subcells, or the first and second subcells.

In other embodiments, such as a three junction solar cell, a distributed Bragg reflector (DBR) layer is provided adjacent to and between the second and the third solar subcells and arranged so at least a portion of which light having a first spectral width wavelength range including the band gap of the second solar subcell can be reflected back into the second solar subcell by the DBR structure, and a second portion of which light in a second spectral width wavelength range corresponding to longer wavelengths than the first spectral width wavelength range can be transmitted through the DBR structure to the third and further subcells disposed beneath the DBR structure.

In some implementations, the distributed Bragg reflector layer is composed of a plurality of alternating layers of lattice matched materials with discontinuities in their respective indices of refraction. In some cases, the difference in refractive indices between alternating layers is maximized in order to minimize the number of periods required to achieve a given reflectivity, and the thickness and refractive index of each period determines the stop band and its limiting wavelength. Further, in some cases, the DBR layer includes a first DBR layer composed of a plurality of n type or p type $Al_xGa_{1-x}As$ layers, and a second DBR layer disposed over the first DBR layer and composed of a plurality of either n type or p type $Al_yGa_{1-y}As$ layers, where y is greater than x, and $0<x<1$, $0<y<1$.

Some implementations provide that at least the base of at least one of the first, second or third solar subcells has a graded doping, i.e., the level of doping varies from one surface to the other throughout the thickness of the base layer. In some embodiments, the gradation in doping is exponential. In some embodiments, the gradation in doping is incremental and monotonic.

In some embodiments, the emitter of at least one of the first, second or third solar subcells also has a graded doping, i.e., the level of doping varies from one surface to the other throughout the thickness of the emitter layer. In some embodiments, the gradation in doping is linear or monotonically decreasing.

Figure 8:
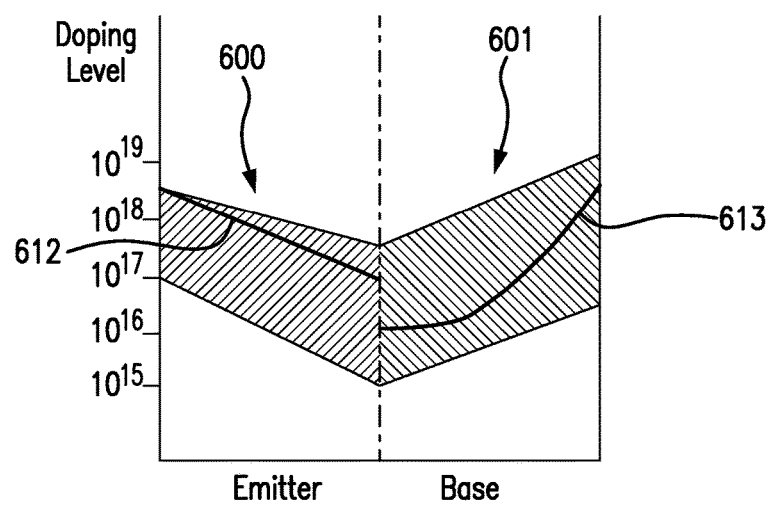
FIG. 8 is a graph of the doping profile in the base and emitter layers of a subcell in the solar cell according to the present disclosure.

As a specific example, the doping profile of the emitter and base layers may be illustrated in FIG. 8, which depicts the amount of doping in the emitter region 600 and the base region 601 of a subcell. N-type dopants include silicon, selenium, sulfur, germanium or tin. P-type dopants include silicon, zinc, chromium, or germanium.

In the example of FIG. 8, in some embodiments, one or more of the subcells have a base region having a gradation in doping that increases from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the base, and an emitter region having a gradation in doping that decreases from a value in the range of approximately $5\times10^{18}$ to $1\times10^{17}$ free carriers per cubic centimeter in the region immediately adjacent the adjoining layer to a value in the range of $5\times10^{15}$ to $1\times10^{18}$ free carriers per cubic centimeter in the region adjacent to the p-n junction.

The heavy line shown in FIG. 8 illustrates one embodiment of the base doping having an exponential gradation, and the emitter doping being linear.

Thus, the doping level throughout the thickness of the base layer may be exponentially graded from the range of $1\times10^{16}$ free carriers per cubic centimeter to $1\times10^{18}$ free carriers per cubic centimeter, as represented by the curve 613 depicted in the Figure.

Similarly, the doping level throughout the thickness of the emitter layer may decline linearly from $5\times10^{18}$ free carriers per cubic centimeter to $5\times10^{17}$ free carriers per cubic centimeter as represented by the curve 612 depicted in the Figure.

The absolute value of the collection field generated by an exponential doping gradient $\exp[-x/\lambda]$ is given by the constant electric field of magnitude $E=kT/q(1/\lambda))(\exp[-x_b/\lambda])$, where k is the Boltzman constant, T is the absolute temperature in degrees Kelvin, q is the absolute value of electronic change, and $\lambda$ is a parameter characteristic of the doping decay.

The efficacy of an embodiment of the doping arrangement present disclosure has been demonstrated in a test solar cell which incorporated an exponential doping profile in the three micron thick base layer a subcell, according to one embodiment.

The exponential doping profile taught by one embodiment of the present disclosure produces a constant field in the doped region. In the particular multijunction solar cell materials and structure of the present disclosure, the bottom subcell has the smallest short circuit current among all the subcells. Since in a multijunction solar cell, the individual subcells are stacked and form a series circuit, the total current flow in the entire solar cell is therefore limited by the smallest current produced in any of the subcells. Thus, by increasing the short circuit current in the bottom cell, the current more closely approximates that of the higher subcells, and the overall efficiency of the solar cell is increased as well. In a multijunction solar cell with approximately efficiency, the implementation of the present doping arrangement would thereby increase efficiency. In addition to an increase in efficiency, the collection field created by the exponential doping profile will enhance the radiation hardness of the solar cell, which is important for spacecraft applications.

Although the exponentially doped profile is the doping design which has been implemented and verified, other doping profiles may give rise to a linear varying collection field which may offer yet other advantages. For example, another doping profile may produce a linear field in the doped region which would be advantageous for both minority carrier collection and for radiation hardness at the end-of-life (EOL) of the solar cell. Such other doping profiles in one or more base layers are within the scope of the present disclosure.

The doping profile depicted herein are merely illustrative, and other more complex profiles may be utilized as would be apparent to those skilled in the art without departing from the scope of the present invention.

Some implementations provide that a quantum well structure is included in middle subcell $B_1$ and $B_2$, and/or $C_1$ and $C_2$. Quantum well structures in multijunction solar cells are known from U.S. patent application Ser. No. 11/788,315, filed Apr. 18, 2007 hereby incorporated by reference.

In some embodiments, the plurality of quantum layers are "strained balanced" by incorporating alternating lower band gap (or larger lattice constant) compressively strained InGaAs and higher band gap (or smaller lattice constant) tensionally strained GaAsP layers so that the larger/smaller atomic lattices/layers of epitaxy balance the strain to keep the quantum well layers lattice matched to the substrate.

In some embodiments, the number of quantum well layers are between 100 and 300, which each layer being between 100 and 300 angstroms in thickness.

In some embodiments, the quantum well layers form an intermediate band gap layer between the emitter layer and the base layer of the second middle subcell.

In some embodiments, the total thickness of the quantum well layers is between two and four microns.

The two or more solar cell subassemblies (e.g., 100 and 200; or 300 and 301; or 300, 400 and 500) that make up the solar cell assembly can be housed in a single package to form a solar cell. The solar cell can include a cover glass to allow sunlight or other radiation to pass to the solar subcells, while protecting the various layers of the solar cell subassemblies from other potentially harmful environmental effects.

The present disclosure can, in some cases, provide advantages over other proposed solar cell structures. For example, a previously reported approach to address over-current production in the Ge subcell of a three-junction device is to grow a second Ge subcell epitaxially over the first Ge subcell (i.e., over a Ge substrate). Such an approach can be challenging because the MOCVD reactor in which the layers are grown typically becomes contaminated with Ge, leading to unintentional doping of the subsequently grown layers with Ge. Further, it can be difficult to grow p-type Ge because of the presence of arsenic (As) on the MOCVD platter as a result of its use as a dopant for growth of n-type Ge. The present disclosure can help alleviate or avoid these problems. Further, the present invention still allows the bottom subcell(s) of the subassemblies to collect at least twice as much current as the upper subcells. By placing the bottom subcells of the subassemblies in series with one another, the overall voltage of the solar cell assembly can be increased.

In some implementations, the selection of the composition of the subcells and their band gaps maximizes the efficiency at high temperature (e.g., in the range of 50 to 100 degrees Centigrade) in deployment in space at a predetermined time after the initial deployment (referred to as the beginning-of-life or (BOL). The predetermined time can be referred to as the end-of-life (EOL).

The present disclosure, like related U.S. patent application Ser. No. 14/828,206, provides a multijunction solar cell that follows a design rule that one should incorporate as many high band gap subcells as possible to achieve the goal to increase the efficiency at either low temperature, room temperature (28° C.), or high temperature (50 to 70° C.) EOL. For example, high band gap subcells may retain a greater percentage of cell voltage as temperature increases, thereby offering lower power loss as temperature increases. As a result, both HT-BOL and HT-EOL performance of the exemplary multijunction solar cell, according to the present disclosure, may be expected to be greater than traditional cells.

In view of different satellite and space vehicle requirements in terms of temperature, radiation exposure, and operational life, a range of subcell designs using the design principles of the present disclosure may provide satisfying typical customer and mission requirements, and several embodiments are set forth hereunder, along with the computation of their efficiency at the end-of-life. The radiation exposure is experimentally measured using 1 MeV electron fluence per square centimeter (abbreviated in the text that follows as e/cm$^2$), so that a comparison can be made between the current commercial devices and embodiments of solar cells discussed in the present disclosure.

As an example, a low earth orbit (LEO) satellite will typically experience radiation equivalent to 5×10$^{14}$ e/cm$^2$ over a five year lifetime. A geosynchronous earth orbit (GEO) satellite will typically experience radiation in the range of 5×10$^{14}$ e/cm$^2$ to 1×10 e/cm$^2$ over a fifteen year lifetime.

As a baseline for comparison, the cell efficiency (%) measured at room temperature (RT) 28° C. and high temperature (HT) 70° C., at the beginning of life (BOL) and end of life (EOL), for a standard three junction commercial solar cell (ZTJ), is as follows:

| Condition | Efficiency | |
|---|---|---|
| BOL 28° C. | 29.1% | |
| BOL 50° C. | 27.% | |
| EOL 50° C. | 24.8% | After 5E14 e/cm2 radiation |
| EOL 50° C. | 23.0% | After 1E15 e/cm2 radiation |

As an example of one of the solar cell assemblies (a five junction solar cell) described in the present disclosure, the corresponding data is as follows:

| Condition | Efficiency | |
|---|---|---|
| BOL 28° C. | 29.7% | |
| BOL 50° C. | 28.3% | |
| EOL 50° C. | 26.6% | After 5E14 e/cm2 radiation |
| EOL 50° C. | 25.6% | After 1E15 e/cm2 radiation |

For low intensity low temperature (LILT) environments, the comparative performance of a four junction solar cell assembly (i.e. three subcells in a first subassembly, and three subcells in the second subassembly) is as follows:

Standard ZTJ Solar Cell

| Condition | Efficiency | |
|---|---|---|
| BOL 28° C. | 36.7% | |
| EOL −125° C. | 27.4% | After 4E15 e/cm$^2$ radiation |

Proposed 4J Dual Ge Solar Cell Assembly

| Condition | Efficiency | |
|---|---|---|
| BOL 28° C. | 27.4% | |
| EOL −125° C. | 29.9% | After 4E15 e/cm$^2$ radiation |

The foregoing new solar cell has a slightly higher cell efficiency than the standard commercial solar cell (ZTJ) at BOL at 50° C. However, the solar cell described in the present disclosure exhibits substantially improved cell efficiency (%) over the standard commercial solar cell (ZTJ) at 1 MeV electron equivalent fluence of 5×10$^{14}$ e/cm$^2$, and dramatically improved cell efficiency (%) over the standard commercial solar cell (ZTJ) at 1 MeV electron equivalent fluence of 1×10$^{15}$ e/cm$^2$.

The wide range of electron and proton energies present in the space environment necessitates a method of describing the effects of various types of radiation in terms of a radiation environment which can be produced under laboratory conditions. The methods for estimating solar cell degradation in space are based on the techniques described by Brown et al. [Brown, W. L., J. D. Gabbe, and W. Rosenzweig, Results of the Telstar Radiation Experiments, Bell System Technical J., 42, 1505, 1963] and Tada [Tada, H. Y., J. R. Carter, Jr., B. E. Anspaugh, and R. G. Downing, Solar Cell Radiation Handbook, Third Edition, JPL Publication 82-69, 1982]. In summary, the omnidirectional space radiation is converted to a damage equivalent unidirectional fluence at a normalized energy and in terms of a specific radiation particle. This equivalent fluence will produce the same damage as that produced by omnidirectional space radiation considered when the relative damage coefficient (RDC) is properly defined to allow the conversion. The relative damage coefficients (RDCs) of a particular solar cell structure are measured a priori under many energy and fluence levels. When the equivalent fluence is determined for a given space environment, the parameter degradation can be evaluated in the laboratory by irradiating the solar cell with the calculated fluence level of unidirectional normally incident flux. The equivalent fluence is normally expressed in terms of 1 MeV electrons or 10 MeV protons.

The software package Spenvis (www.spenvis.oma.be) can be used to calculate the specific electron and proton fluence that a solar cell is exposed to during a specific satellite mission as defined by the duration, altitude, azimuth, etc. Spenvis employs the EQFLUX program, developed by the Jet Propulsion Laboratory (JPL) to calculate 1 MeV and 10 MeV damage equivalent electron and proton fluences, respectively, for exposure to the fluences predicted by the trapped radiation and solar proton models for a specified mission environment duration. The conversion to damage equivalent fluences is based on the relative damage coefficients determined for multijunction cells [Marvin, D. C., Assessment of Multijunction Solar Cell Performance in Radiation Environments, Aerospace Report No. TOR-2000 (1210)-1, 2000]. New cell structures eventually need new RDC measurements as different materials can be more or less damage resistant than materials used in conventional solar cells. A widely accepted total mission equivalent fluence for a geosynchronous satellite mission of 15 year duration is 1 MeV at $5 \times 10^{14}$ to $1 \times 10^{15}$ electrons/cm$^2$.

The exemplary solar cell subassemblies, solar assemblies and solar cells described herein may make the use of aluminum in the semiconductor composition of each of the top subcells desirable, at least for some implementations. Aluminum incorporation is widely known in the III-V compound semiconductor industry to degrade BOL subcell performance due to deep level donor defects, higher doping compensation, shorter minority carrier lifetimes, and lower cell voltage and an increased BOL $E_g/q - V_{oc}$ metric. In short, increased BOL $E_g/q - V_{oc}$ may be the most problematic shortcoming of aluminum containing subcells; the other limitations can be mitigated by modifying the doping schedule or thinning base thicknesses.

Various modifications can be made to the foregoing examples. Accordingly, other implementations are within the scope of the claims.

What is claimed is:

1. A solar cell module including a terminal of first polarity and a terminal of second polarity comprising:
   a first semiconductor body including a tandem vertical stack of at least a first solar subcell, a second solar subcell, and a third solar subcell; and
   a second semiconductor body disposed laterally adjacent to the first semiconductor body and including a tandem vertical stack of at least a first solar subcell, a second solar subcell, and a third solar subcell,
   wherein the third solar subcell of the second semiconductor body is substantially identical to the third solar subcell of the first semiconductor body,
   wherein the first solar subcell of each of the first and second semiconductor bodies has a top contact connected to the terminal of first polarity and is positioned within the respective vertical stacks toward a light receiving surface of the first semiconductor body and the second semiconductor body,
   wherein the third solar subcell of the second semiconductor body has a bottom contact connected to the terminal of second polarity;
   wherein the second solar subcell of the first semiconductor body and the second solar subcell of the second semiconductor body are electrically connected in parallel with a connection of the second polarity, and the second polarity connection of the two second solar subcells are connected in series to a contact at the first polarity of the third solar subcell of the first semiconductor body; and
   wherein a contact of the second polarity of the third solar subcell of the first semiconductor body is connected in a series electrical circuit with a contact at the first polarity of the third solar subcell of the second semiconductor body so that the interconnection of solar subcells of the first and second semiconductor bodies forms at least a four junction solar cell.

2. The solar cell module as defined in claim 1, wherein the first solar subcell of the first semiconductor body is composed of indium gallium phosphide (InGaP);
   the second solar subcell of the first semiconductor body is disposed adjacent to and lattice matched to said first solar subcell of the first semiconductor body, the second solar subcell of the first semiconductor body being composed of aluminum gallium arsenide (AlGaAs) or indium gallium arsenide phosphide (InGaAsP); and
   the third solar subcell of the first semiconductor body is lattice matched to said second solar subcell of the first semiconductor body, and is composed of germanium (Ge).

3. The solar cell module as defined in claim 1, wherein the first solar subcell of the first semiconductor body is composed of aluminium indium gallium phosphide (AlInGaP);
   the second solar subcell of the first semiconductor body is disposed adjacent to and lattice matched to said first solar subcell of the first semiconductor body, and is composed of aluminum gallium arsenide (AlGaAs); and
   the third solar subcell of the first semiconductor body is disposed adjacent to and lattice matched to said second solar subcell of the first semiconductor body and is composed of gallium arsenide (GaAs).

4. The solar cell module as defined in claim 1, wherein first and second semiconductor bodies further comprise a first highly doped lateral conduction layer disposed adjacent to and beneath the second solar subcell.

5. The solar cell module as defined in claim 4, wherein the first and second semiconductor bodies further comprise a blocking p-n diode or insulating layer disposed adjacent to and beneath the highly doped lateral conduction layer.

6. The solar cell module as defined in claim 5, wherein the first and second semiconductor bodies further comprise a second highly doped lateral conduction layer disposed adjacent to and beneath the blocking p-n diode or insulating layer,
   wherein the second solar subcell of the first semiconductor body has a bottom contact and the third solar subcell of the first semiconductor body has a top contact, the bottom contact of the second solar subcell of the first semiconductor body being electrically connected to the top contact of the third solar subcell of the first semiconductor body by an intra-cell interconnect,
   wherein the bottom contact of the second solar subcell of the first semiconductor body is electrically connected to the first highly doped lateral conduction layer of the first semiconductor body, and wherein the top contact of the third solar subcell of the first semiconductor body is electrically connected to the second highly doped lateral conduction layer of the first semiconductor body.

7. The solar cell module as defined in claim 1, wherein each of the first and second semiconductor bodies further comprise a fourth middle solar subcell composed of gallium arsenide (GaAs) disposed adjacent to and beneath the first solar subcell of each of the first semiconductor body and second semiconductor body.

8. The solar cell module as defined in claim 1, wherein the short circuit density ($J_{sc}$) of each of the third solar subcells of the first and second semiconductor bodies is at least twice that of the first and second solar subcells of each of the first and second semiconductor bodies.

9. The solar cell module as defined in claim 1, wherein the short circuit current density ($J_{sc}$) of the first and second solar subcells of the first and second semiconductor bodies is each approximately 17 mA/cm$^2$, and the short circuit current density ($J_{sc}$) of each of the third solar subcells of the first and second semiconductor bodies is approximately 34 mA/cm$^2$.

10. The solar cell module as defined in claim 7, wherein the short circuit current density ($J_{sc}$) of the first solar subcell, second solar subcell, and fourth middle solar subcell of the first semiconductor body, and the first solar subcell, second solar subcell, and fourth middle solar subcell of the second semiconductor body are each approximately 11 mA/cm$^2$.

11. The solar cell module as defined in claim 10, wherein the short circuit current density ($J_{sc}$) of each of the third solar subcells of the first semiconductor body and of the second semiconductor body is approximately 22.6 mA/cm$^2$.

12. The solar cell module as defined in claim 3, wherein at least the base of at least one of the first, second or third solar subcells of the first and second semiconductor bodies has a graded doping.

13. The solar cell module as defined in claim 1, further comprising a first conductive interconnect extending between the top contact of the first solar subcell of the first semiconductor body to the top contact of the first solar subcell of the second semiconductor body.

14. The solar cell module as defined in claim 13, wherein the second solar subcell of the second semiconductor body has a bottom contact, the solar cell module further comprising a second conductive interconnect extending between the bottom contact of the second solar subcell of the first semiconductor body to the bottom contact of the second solar subcell of the second semiconductor body.

15. The solar cell module as defined in claim 14, wherein the third solar subcell of the first semiconductor body has a bottom contact and the third solar subcell of the second semiconductor body has a top contact, the solar cell module further comprising a third conductive interconnect extending between the bottom contact of the third solar subcell of the first semiconductor body to the top contact of the third solar subcell of the second semiconductor body.

16. The solar cell module as defined in claim 7, wherein the third solar subcell of the first semiconductor body has a bottom contact and the third solar subcell of the second semiconductor body has a top contact.

17. The solar cell module as defined in claim 1, further comprising:
a third semiconductor body disposed adjacent to the first and second semiconductor bodies and including a tandem vertical stack of at least a first solar subcell, a second solar subcell, a third solar subcell, and a fourth solar subcell, the first solar subcell having a top contact connected to the terminal of first polarity;
wherein each of the first and second semiconductor bodies further comprise a fourth solar subcell disposed adjacent to and beneath the first solar subcell of each of the respective first and second semiconductor bodies; and
wherein the top contact of the first solar subcells of the first, second and third semiconductor bodies are connected, and the third solar subcell of the first semiconductor body is connected in a series electrical circuit with the third solar subcell of the third semiconductor body, which in turn is connected in a series electrical circuit with the third solar subcell of the second semiconductor body, which is connected to the terminal of second polarity.

18. The solar cell module as defined in claim 1, wherein the respective selection of the composition, band gaps, open circuit voltage, and short circuit current of each of the solar subcells maximizes the efficiency of the assembly (i) at temperature in the range of 40 to 100 degrees Centigrade in deployment in space at a predetermined time after an initial deployment (referred to as the beginning of life or BOL), the predetermined time being referred to as the end-of-life (EOL), wherein the predetermined time is in the range of one to twenty-five years; or (ii) at temperature in the range of −150 to −100 degrees Centigrade, and low solar radiation intensity less than 0.1 suns, in deployment in space at a predetermined time after the initial deployment (referred to as the beginning of life or BOL), such predetermined time being referred to as the end-of-life (EOL), wherein such predetermined time is in the range of one to twenty-five years.

19. The solar cell module as defined in claim 1, wherein one or more of the first solar subcell, second solar subcell, or third solar subcell of the first and second semiconductor bodies has a base region having a gradation in doping that increases exponentially from a value in the range of $1\times10^{15}$ to $1\times10^{18}$ free carriers per cubic centimeter adjacent a p-n junction to a value in the range of $1\times10^{16}$ to $4\times10^{18}$ free carriers per cubic centimeter adjacent to an adjoining layer at a rear of the base, and an emitter region having a gradation in doping that decreases from a value in the range of approximately $5\times10^{18}$ to $1\times10^{17}$ free carriers per cubic centimeter in a region immediately adjacent an adjoining layer to a value in the range of $5\times10^{15}$ to $1\times10^{18}$ free carriers per cubic centimeter in the region adjacent to the p-n junction.

20. A method of forming a solar cell assembly including a terminal of first polarity and a terminal of second polarity comprising:
forming a semiconductor body including a tandem vertical stack of at least a first solar subcell, a second solar subcell, and a third solar subcell;
separating the semiconductor body into discrete first and second semiconductor bodies, each including the tandem vertical stack of the first solar subcell, second solar subcell, and third solar subcell;
mounting the second semiconductor body adjacent to the first semiconductor body;
providing a bottom contact on the third solar subcell of the second semiconductor body;
connecting the bottom contact on the third solar subcell of the second semiconductor body to the terminal of second polarity;
electrically connecting in parallel contacts of the second polarity of the second solar subcells of the first and the second semiconductor bodies to a contact of the first polarity of the third solar subcell of the first semiconductor body to form a series electrical connection of three solar subcells;

wherein a contact of the second polarity of the third solar subcell of the first semiconductor body is connected in a series electrical circuit with a contact at the first polarity of the third solar subcell of the second semiconductor body so that the interconnection of solar subcells of the first and second semiconductor bodies forms at least a four junction solar cell connecting the third solar subcell of the first semiconductor body in a series electrical circuit with the third solar subcell of the second semiconductor body so that at least a four junction solar cell is formed by the assembly;

providing a bottom contact on the second solar subcell of the first semiconductor body and a top contact on the third solar subcell of the first semiconductor body, connecting the bottom contact of the second solar subcell of the first semiconductor body being to the top contact of the third solar subcell of the first semiconductor body by an intra-cell interconnect; and providing a top electric contact on the first solar subcell of the first and second semiconductor bodies and electrically connecting the top electrical contact to the terminal of first polarity.

\* \* \* \* \*